US009747979B2

(12) United States Patent
Nakayama et al.

(10) Patent No.: US 9,747,979 B2
(45) Date of Patent: Aug. 29, 2017

(54) NONVOLATILE SEMICONDUCTOR STORAGE DEVICE INCLUDING CELL TRANSISTOR PERFORMANCE MEASURING CELLS

(71) Applicant: Panasonic Intellectual Property Management Co., Ltd., Osaka (JP)

(72) Inventors: Masayoshi Nakayama, Kyoto (JP); Kazuyuki Kouno, Osaka (JP); Reiji Mochida, Osaka (JP); Keita Takahashi, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/826,162

(22) Filed: Aug. 13, 2015

(65) Prior Publication Data
US 2015/0348626 A1 Dec. 3, 2015

Related U.S. Application Data

(63) Continuation of application No. PCT/JP2014/000806, filed on Feb. 17, 2014.

(30) Foreign Application Priority Data

Feb. 19, 2013 (JP) ................. 2013-030228

(51) Int. Cl.
| *G11C 11/16* | (2006.01) |
| *G11C 7/14* | (2006.01) |
| *G11C 8/08* | (2006.01) |
| *G11C 29/24* | (2006.01) |
| *G11C 13/00* | (2006.01) |
| *H01L 27/10* | (2006.01) |
| *H01L 45/00* | (2006.01) |

(Continued)

(52) U.S. Cl.
CPC .............. *G11C 13/004* (2013.01); *G11C 7/14* (2013.01); *G11C 8/08* (2013.01); *G11C 11/16* (2013.01);
(Continued)

(58) Field of Classification Search
CPC ............ G11C 13/0007; G11C 13/0004; G11C 13/0002; G11C 11/16; G11C 2213/31
See application file for complete search history.

(56) References Cited

U.S. PATENT DOCUMENTS 7,688,634 B2 * 3/2010 Richter ................. G11C 16/10
365/185.2
7,869,265 B2 * 1/2011 Shimizu ................. G11C 11/16
365/130

(Continued)

FOREIGN PATENT DOCUMENTS

JP 2004-185753 A 7/2004
JP 2004-234707 A 8/2004
(Continued)

OTHER PUBLICATIONS

International Search Report issued in corresponding International Patent Application No. PCT/JP2014/000806, mailed on Apr. 8, 2014; 5 pages with English translation.

*Primary Examiner* — Amir Zarabian
*Assistant Examiner* — Roberto Mancera, Jr.
(74) *Attorney, Agent, or Firm* — McDermott Will & Emery LLP

(57) ABSTRACT

A memory array includes a plurality of memory cells arranged in a matrix, each memory cell including a cell transistor and a variable resistance element connected to an end of the cell transistor, and a cell transistor performance measuring cell including a MOS transistor. The cell transistor performance measuring cell is used to stabilize resistance values in a low resistance state and a high resistance state of the variable resistance element irrespective of variations in the cell transistor and thereby improve read characteristics and reliability characteristics of a nonvolatile semiconductor storage device.

20 Claims, 12 Drawing Sheets

(51) Int. Cl.
*H01L 27/24* (2006.01)
*G11C 29/12* (2006.01)

(52) U.S. Cl.
CPC ...... *G11C 11/1673* (2013.01); *G11C 11/1675* (2013.01); *G11C 13/0002* (2013.01); *G11C 13/0004* (2013.01); *G11C 13/0007* (2013.01); *G11C 13/0038* (2013.01); *G11C 13/0069* (2013.01); *G11C 29/24* (2013.01); *H01L 27/101* (2013.01); *H01L 27/2436* (2013.01); *H01L 45/04* (2013.01); *H01L 45/1233* (2013.01); *G11C 2013/0054* (2013.01); *G11C 2013/0071* (2013.01); *G11C 2013/0073* (2013.01); *G11C 2029/1202* (2013.01); *G11C 2213/79* (2013.01); *G11C 2213/82* (2013.01)

(56) References Cited

U.S. PATENT DOCUMENTS

| | | | |
|---|---|---|---|
| 8,000,127 B2 * | 8/2011 | Hamilton | B82Y 10/00 365/100 |
| 8,111,538 B2 * | 2/2012 | Hosotani | G11C 7/20 365/148 |
| 9,030,865 B2 * | 5/2015 | Chow | G11C 11/16 365/158 |
| 2004/0114427 A1 | 6/2004 | Hamaguchi | |
| 2004/0114444 A1 | 6/2004 | Matsuoka | |
| 2008/0019163 A1 | 1/2008 | Hoenigschmid et al. | |
| 2008/0049487 A1 | 2/2008 | Yoshimura et al. | |
| 2009/0010045 A1 * | 1/2009 | Ueda | G11C 11/15 365/158 |
| 2009/0129141 A1 | 5/2009 | Hosotani et al. | |
| 2009/0323397 A1 * | 12/2009 | Kinoshita | G11C 13/0007 365/148 |
| 2014/0104933 A1 | 4/2014 | Yamahira | |

FOREIGN PATENT DOCUMENTS

| | | |
|---|---|---|
| JP | 2008-027571 A | 2/2008 |
| JP | 2008-052781 A | 3/2008 |
| JP | 2009-129491 A | 6/2009 |
| WO | 2012/176452 A1 | 12/2012 |

\* cited by examiner

|  | PROGRAM (RESET) | ERASE (SET) | READ |
|---|---|---|---|
| WL | Vg_reset | Vg_set | Vg_read |
| BL | Vreset | VSS | Vread |
| SL | VSS | Vset | VSS |
| OPERATION | TO HIGH RESISTANCE STATE (DATA "0") | TO LOW RESISTANCE STATE (DATA "1") | READ "0" OR "1" |

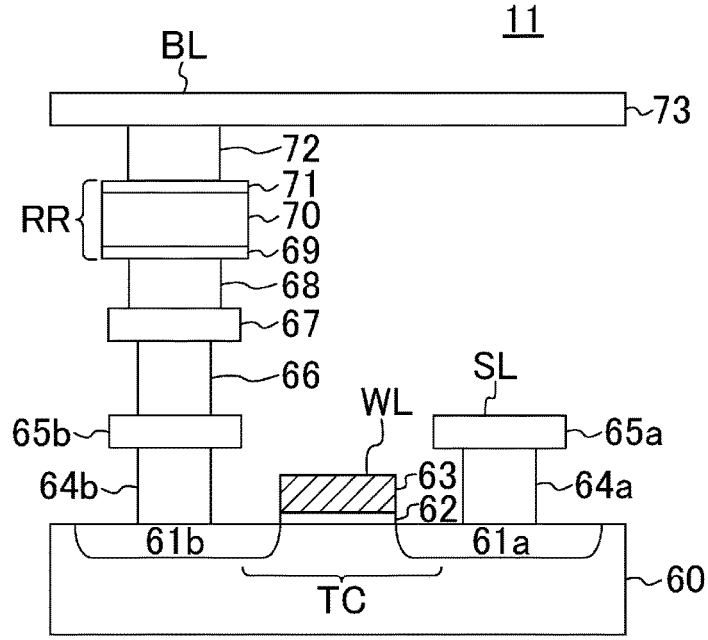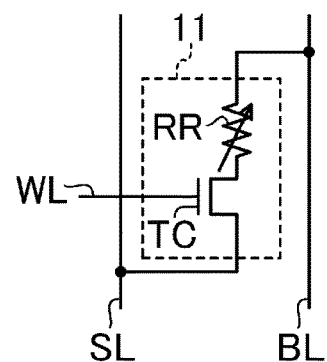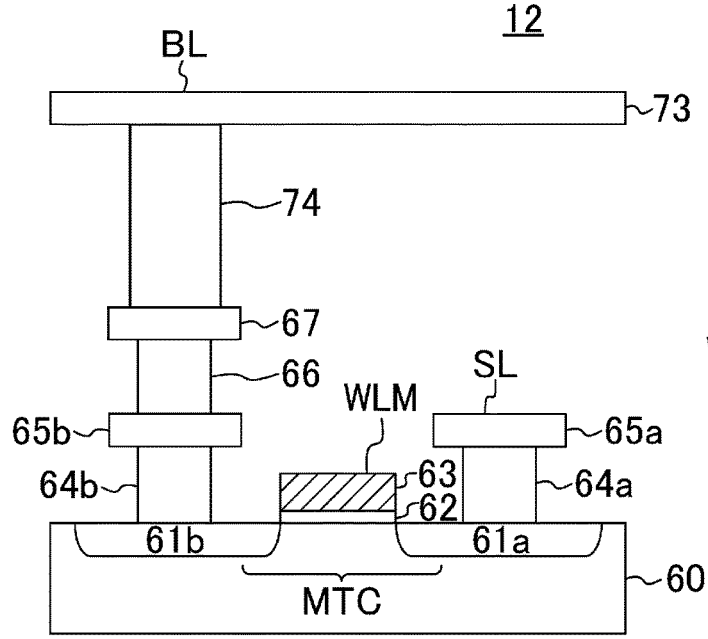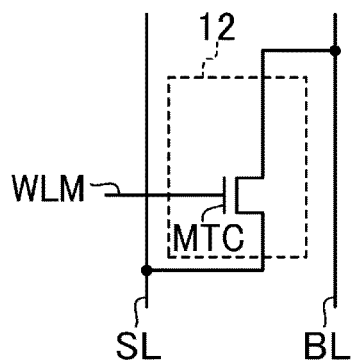

FIG.10

|   | SETTINGS FOR PROVIDING PROGRAM VOLTAGE | SETTINGS FOR PROVIDING ERASE VOLTAGE |
|---|---|---|
| WLM | Vg_resetm | Vg_setm |
| BL | Vresetm | VSS |
| SL | VSS | Vsetm |

FIG.11

|   | PROGRAM (RESET) | ERASE (SET) |
|---|---|---|
| WL | Vg_reseta | Vg_seta |
| BL | Vreseta | VSS |
| SL | VSS | Vseta |
| OPERATION | TO HIGH RESISTANCE STATE (DATA "0") | TO LOW RESISTANCE STATE (DATA "1") |

NONVOLATILE SEMICONDUCTOR STORAGE DEVICE INCLUDING CELL TRANSISTOR PERFORMANCE MEASURING CELLS

CROSS-REFERENCE TO RELATED APPLICATIONS

This is a continuation of International Application No. PCT/JP2014/000806 filed on Feb. 17, 2014, which claims priority to Japanese Patent Application No. 2013-030228 filed on Feb. 19, 2013. The entire disclosures of these applications are incorporated by reference herein.

BACKGROUND

The present disclosure relates to a nonvolatile semiconductor storage device including resistive memory cells each of which includes a variable resistance element and a cell transistor for selecting the variable resistance element, which are connected together in series. More particularly, the present disclosure relates to a technique of stabilizing resistance values in a low resistance state and a high resistance state of the variable resistance element irrespective of variations in the cell transistor and thereby improving read characteristics and reliability characteristics of the nonvolatile semiconductor storage device.

There has in recent years been an increasing demand for electronic apparatuses, particularly mobile telephones (smartphones), portable music players, digital cameras, tablet terminals, etc., leading to an increasing demand for nonvolatile semiconductor storage devices. Various technologies for further improving capacity, size, write speed, read speed, and low power consumption operation are currently under development.

Flash memory dominates the nonvolatile memory market today. However, the write time is topping out at as low as the microsecond or millisecond scale. This is a factor that inhibits improvement in performance of set apparatuses including the nonvolatile memory device.

Various alternative nonvolatile memory technologies that can write at higher speed and lower power consumption than those of flash memory have in recent years been developed. One of such nonvolatile memory devices is, for example, resistive random access memory (ReRAM), which employs a variable resistance element as a memory element. Resistive random access memory can have a nanosecond-scale write time, i.e., can perform high-speed write. In addition, a voltage used to write in resistive random access memory is about 1.6 V compared to 10 V or more in flash memory, which allows the nonvolatile memory to operate with lower power consumption.

Japanese Unexamined Patent Publication No. 2004-234707 describes a memory array configuration of resistive random access memory. A memory cell in resistive random access memory includes a series connection of a variable resistance element and a cell transistor. The variable resistance element stores data ("0" or "1") according to whether the variable resistance element is set to a low resistance value or a high resistance value, where the resistance value ranges from 1 kΩ to 1 MΩ, for example. When the resistance value of the variable resistance element is low, the memory cell current is large. When the resistance value of the variable resistance element is high, the memory cell current is small. Therefore, by detecting the difference in memory cell current using a sense amplifier circuit during read operation, data stored in a memory cell is read out.

Japanese Unexamined Patent Publication No. 2008-052781 describes a programming circuit configuration of resistive random access memory. The variable resistance element is reversibly switched between the low and high resistance states, depending on the polarity of a voltage applied to the opposite ends of the variable resistance element.

However, the above conventional nonvolatile resistive random access memory has the following problem. Specifically, the resistance values in the high and low resistance states depend on a voltage applied to the variable resistance element during program operation or erase operation, and such a voltage is largely affected by the threshold voltage of the cell transistor. Therefore, the resistance values in the high and low resistance states vary depending on manufacturing variations in the threshold voltage of the cell transistor.

The above problem will be described with reference to FIGS. 1, 2, 3, and 4.

FIG. 1 shows a resistive memory cell including a series connection of a variable resistance element RR and a cell transistor TC.

FIG. 2 shows values of voltages applied to terminals of a resistive memory cell including a series connection of a variable resistance element RR and a cell transistor TC, which is included in a conventional nonvolatile semiconductor storage device, during program operation, erase operation, and read operation.

In the memory cell, the gate of the cell transistor is connected to a word line WL, a terminal closer to the variable resistance element is connected to a bit line BL, and a terminal closer to the cell transistor is connected to a source line SL.

During program operation of the memory cell, a program word line voltage Vg_reset (e.g., 2.4 V) is applied to the word line WL, so that the memory cell is in the conducting state, and a program bit line voltage Vreset (e.g., 2.4 V) is applied to the bit line BL and a ground voltage VSS is applied to the source line SL, and therefore, a voltage VR applied to the variable resistance element RR causes the memory cell to be in the high resistance state.

During erase operation, an erase word line voltage Vg_set (e.g., 2.4 V) is applied to the word line WL, so that the memory cell is in the conducting state, and the ground voltage VSS is applied to the bit line BL and an erase voltage Vset (e.g., 2.4 V) is applied to the source line SL, so that the voltage VR applied to the variable resistance element RR causes the memory cell to be in the low resistance state.

During read operation, a read word line voltage Vg_read (e.g., 1.8 V) is applied to the word line WL, so that the cell transistor is in the conducting state. Thereafter, a read bit line voltage Vread (e.g., 0.4 V) is applied to the bit line BL and the ground voltage VSS is applied to the source line SL, so that a current flows through the memory cell. The current is small when the variable resistance element RR is in the high resistance state and large when the variable resistance element RR is in the low resistance state. Based on this, the data state is determined.

FIG. 3 shows current-voltage characteristics of the resistive memory cell during program operation or erase operation. The voltage (VR) indicates a voltage applied to the variable resistance element RR during the program operation or erase operation, and the current indicates a value of a current flowing at that time.

Here, during erase operation in which the variable resistance element RR is caused to be in the low resistance state, the voltage VR applied to the variable resistance element RR varies depending on the threshold voltage of the cell transistor TC, and is lower than the erase source line voltage Vset. Therefore, if the threshold voltage of the cell transistor TC is low, the voltage VR applied is relatively high, and the resistance value after erase operation becomes low (current-voltage characteristics 40). If the threshold voltage of the cell transistor TC is high, the voltage VR applied is relatively low, and the resistance value after erase operation becomes high (current-voltage characteristics 41).

During program operation in which the variable resistance element RR is caused to be in the high resistance state, if the threshold voltage of the cell transistor TC is low, the resistance value after program operation becomes high. If the threshold voltage is high, the resistance value after program operation becomes low. Note that, as compared to erase operation, the reduction in the voltage VR applied to the variable resistance element RR with respect to the program bit line voltage Vreset is low and therefore has a relatively small influence.

FIG. 4 shows a distribution of a current flowing through the memory cell during read operation after the above program operation or erase operation in a nonvolatile semiconductor storage device including a plurality of resistive memory cells. A distribution in a region having high cell currents during read operation is a bit current distribution after erase operation, and a distribution in a region having low cell currents during read operation is a bit current distribution after program operation. During read operation, data is determined by comparison with a predetermined read reference current (Iref).

When the threshold voltage of the cell transistor TC is low due to the influence of the threshold voltage of the cell transistor TC on the resistance value after write operation, the resistance value after erase operation becomes low, so that the bit current distribution (bit current distribution 50) is located in a region where the current is high, and the resistance value after program operation becomes high, so that the bit current distribution (bit current distribution 50) is located in a region where the current is low.

On the other hand, if the threshold voltage of the cell transistor TC is high, the resistance value after erase operation becomes high, so that the bit current distribution (bit current distribution 51) is located in a region where the current is lower than in the bit current distribution 50, and the resistance value after program operation becomes low, so that the bit current distribution (bit current distribution 51) is located in a region where the current is higher than in the bit current distribution 50.

Thus, the influence of the threshold voltage of the cell transistor TC on the bit current distribution after write operation affects reliability characteristics, such as read operation characteristics, repetitive write characteristics, etc.

For example, the bit current distribution 50 can have a larger current difference 52 than a current difference 53 between the bit current distribution after write operation in the bit current distribution 51 and the reference current (Iref). Therefore, to improve read operation characteristics, it is necessary to cause the voltage VR applied to the variable resistance element RR during write operation to be higher than or equal to a predetermined voltage. However, this does not mean that any high voltage is effective. If a predetermined voltage or more is applied, repetitive write characteristics may be adversely affected. For example, the variable resistance element RR may not be switched from the high resistance state to the low resistance state, or from the low resistance state to the high resistance state, so that write operation cannot be performed. Therefore, the voltage VR may be limited to a predetermined voltage or less.

Thus, to allow a nonvolatile semiconductor storage device including resistive memory cells to have write operation that simultaneously has good read operation characteristics and repetitive write characteristics, it is necessary to optimize the voltage applied to the variable resistance element RR during write operation.

However, in conventional nonvolatile semiconductor storage devices, a predetermined voltage is applied during write operation, and therefore, if there are manufacturing variations in threshold voltage of the cell transistor TC, the voltage VR applied to the variable resistance element RR during write operation varies, and therefore, it is difficult to apply an optimal voltage to the variable resistance element RR.

SUMMARY

The present disclosure describes implementations of a nonvolatile semiconductor storage device in which a predetermined voltage is applied to the variable resistance element during write operation irrespective of the threshold voltage of the cell transistor, and therefore, the resistance values in the low and high resistance states can be caused to be stable, whereby read operation characteristics and reliability characteristics can be improved.

A nonvolatile semiconductor storage device according to an embodiment of the present disclosure includes a plurality of memory cells arranged in a matrix having rows and columns, each memory cell including a cell transistor and a variable resistance element connected to a first terminal of the cell transistor, a plurality of word lines provided, corresponding to the respective rows of the plurality of memory cells, each word line being connected to gates of the cell transistors included in the memory cells provided in the corresponding row, a plurality of first data lines provided, corresponding to the respective rows or columns of the plurality of memory cells, each first data line being connected to the variable resistance elements included in the plurality of memory cells provided in the corresponding row or column, a plurality of second data lines provided, corresponding to the respective rows or columns of the plurality of memory cells, each second data line being connected to second terminals of the cell transistors included in the plurality of memory cells provided in the corresponding row or column, at least one cell transistor performance measuring cell arranged in a matrix having rows and columns, each cell transistor performance measuring cell including a transistor, and at least one cell transistor performance measuring word line provided, corresponding to the respective rows of the at least one cell transistor performance measuring cell, each cell transistor performance measuring word line being connected to a gate of the at least one transistor provided in the corresponding row. The transistor of the at least one cell transistor performance measuring cell is provided, corresponding to each row or column of the at least one cell transistor performance measuring cell, and a drain or source of the transistor of at least one cell transistor performance measuring cell provided in the row or column is connected to all or a portion of the plurality of first data lines. The transistor of the at least one cell transistor performance measuring cell is provided, corresponding to each row or column of the at least one cell transistor performance measuring cell, and one of the drain and source of the transistor of the at least one cell transistor performance measuring cell provided in the row or column, the one of the drain and source being not connected to the first data line, is connected to all or a portion of the plurality of second data lines.

According to the present disclosure, a predetermined voltage can be applied to the variable resistance element during write operation irrespective of the threshold voltage of the cell transistor. Therefore, the resistance values in the low and high resistance states can be caused to be stable. Therefore, a nonvolatile semiconductor storage device with improved read operation characteristics and reliability characteristics can be provided.

BRIEF DESCRIPTION OF THE DRAWINGS

FIG. 7A is a cross-sectional view of a memory cell of a nonvolatile semiconductor storage device according to an embodiment of the present disclosure.

FIG. 7B is a circuit diagram of the memory cell of FIG. 7A.

FIG. 8A is a cross-sectional view of a cell transistor performance measuring cell of a nonvolatile semiconductor storage device according to an embodiment of the present disclosure.

FIG. 8B is a circuit diagram of the cell transistor performance measuring cell of FIG. 8A.

FIG. 10 is a diagram showing values of voltages applied to a cell transistor performance measuring cell during current measurement in a nonvolatile semiconductor storage device according to an embodiment of the present disclosure.

FIG. 11 is a diagram showing values of voltages applied to a memory cell during write operation in a nonvolatile semiconductor storage device according to an embodiment of the present disclosure.

DETAILED DESCRIPTION

Embodiments will now be described in detail with reference to the accompanying drawings. Note that terms meaning "sameness" (e.g., "the same," "the same shape," etc.) are assumed to encompass manufacturing variations.

First Embodiment

Figures 1, 2:
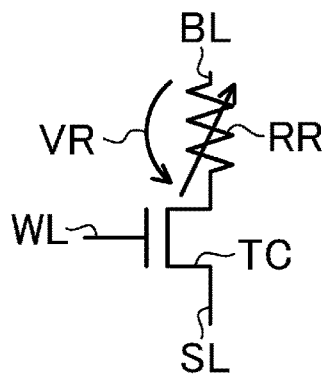
FIG. 1 is a diagram showing a conventional resistive memory cell including a series connection of a variable resistance element and a cell transistor.
FIG. 2 is a diagram showing values of voltages applied to a memory cell during various operations in a conventional nonvolatile semiconductor storage device.
Figure 3:
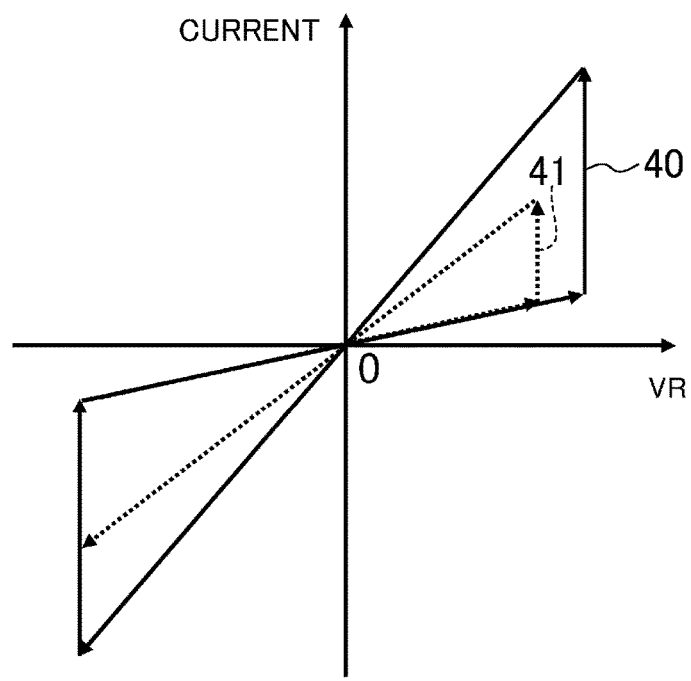
FIG. 3 is a diagram showing current-voltage characteristics during program operation or erase operation in a conventional nonvolatile semiconductor storage device.
Figure 4:
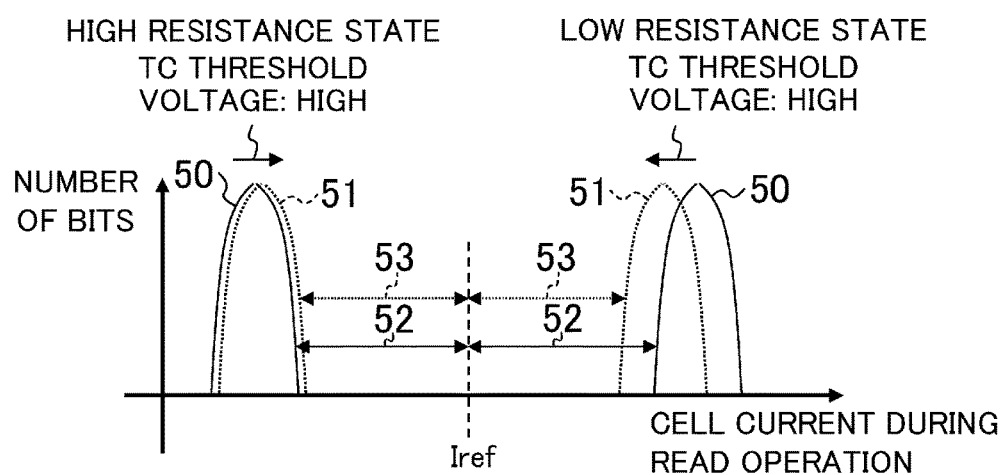
FIG. 4 is a diagram showing a bit distribution of a cell current during read operation after program operation or erase operation in a conventional nonvolatile semiconductor storage device.
Figure 5:
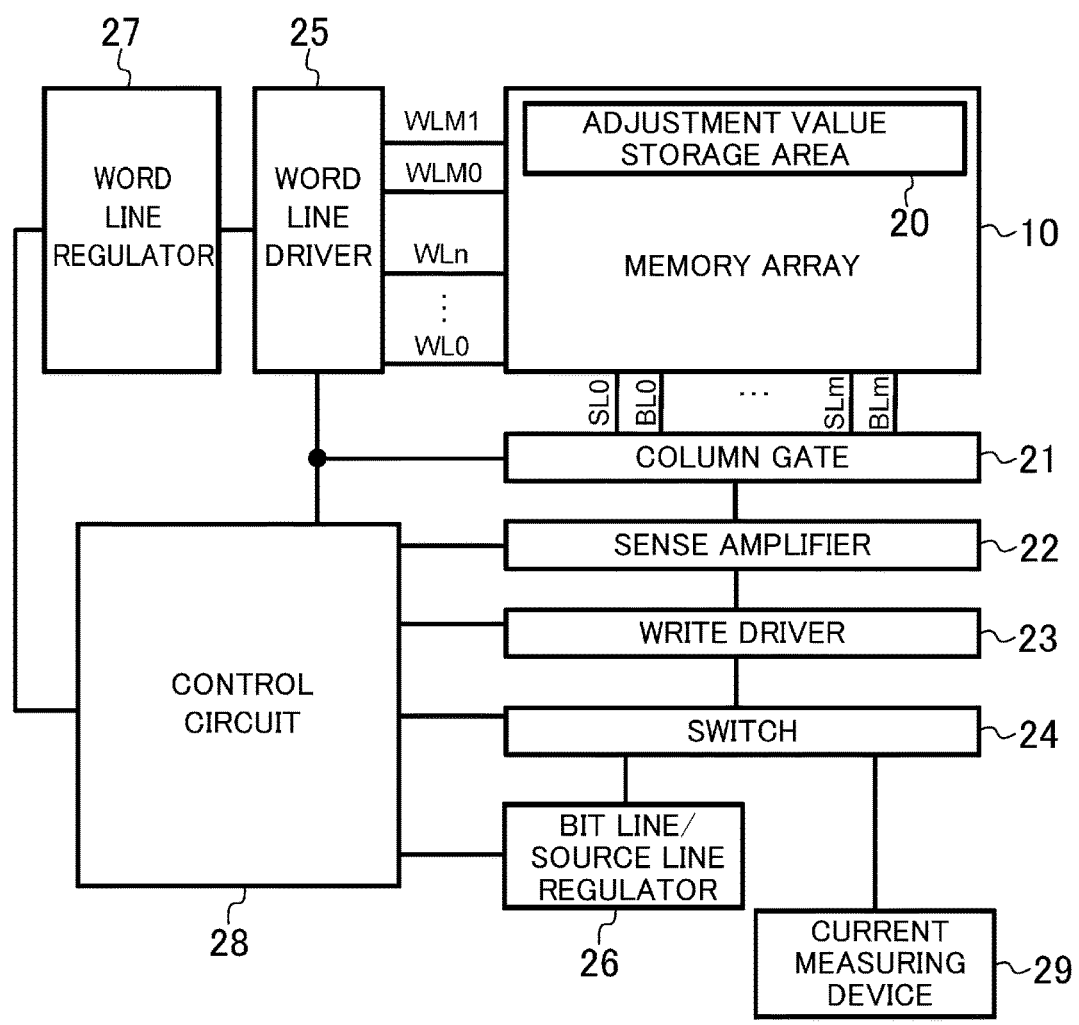
FIG. 5 is a diagram showing an overall configuration of a nonvolatile semiconductor storage device according to a first embodiment of the present disclosure.

FIG. 5 is a diagram showing a nonvolatile semiconductor storage device according to a first embodiment of the present disclosure, and a current measuring device provided external to the nonvolatile semiconductor storage device.

As shown in FIG. 5, the nonvolatile semiconductor storage device includes a memory array 10, an adjustment value storage area 20 provided in the memory array 10, a column gate 21, a sense amplifier 22, a write driver 23, a switch 24, a word line driver 25, a bit line/source line regulator 26, a word line regulator 27, a control circuit 28, a plurality of word lines WL0-WLn (abbreviated to "WL" where appropriate), a plurality of bit lines BL0-BLm (abbreviated to "BL" where appropriate) as first data lines, a plurality of source lines SL0-SLm (abbreviated to "SL" where appropriate) as second data lines, and cell transistor performance measuring word lines WLM0 and WLM1 (abbreviated to "WLM" where appropriate). Note that the subscript "n" of the word line WL and the subscript "m" of the source line SL and the bit line BL are each a natural number.

A current measuring device 29 is connected to the nonvolatile semiconductor storage device. The current measuring device 29 may be provided external to or within the nonvolatile semiconductor storage device.

The memory array 10 includes a plurality of memory cells for storing data, and cell transistor performance measuring cells described below, in addition to the adjustment value storage area 20. The memory array 10 will be described in detail below.

The column gate 21 is a circuit that receives a control signal (not shown), and selects and connects a bit line BL and a source line SL that are specified by the control signal to the sense amplifier 22 or the write driver 23.

The sense amplifier 22 is a circuit that determines whether data read from a memory cell in the memory array 10 is "0" or "1." The column gate 21 selects one of the bit lines BL0-BLm, and compares a current flowing through a memory cell with a reference current, to read data from the memory cell.

The write driver 23 is a circuit that applies a write voltage to a memory cell in the memory array 10 to perform data write operation on the memory cell, or applies a current measuring voltage to a cell transistor performance measuring cell described below. Specifically, the write driver 23 applies a positive voltage supplied from the switch 24, or a ground voltage, to a bit line BL or source line SL that is selected by the column gate 21.

The switch 24 is a circuit that selects a positive voltage that is to be supplied to the write driver 23. During write operation, the switch 24 supplies an output voltage of the bit line/source line regulator 26, as a voltage that is to be applied to a bit line BL or a source line SL, to the write driver 23. When a cell transistor performance measuring cell performs current measurement, the switch 24 supplies a voltage supplied from the current measuring device 29 to the write driver 23.

The word line driver 25 is a circuit that receives a control signal (not shown), and selects a word line WL or cell transistor performance measuring word line WLM that is specified by the control signal, to drive a voltage (described below) applied from the word line regulator 27.

The bit line/source line regulator 26 is a voltage generation circuit that, during data write operation on a memory cell, supplies a voltage that is to be applied to a bit line BL or a source line SL, to the write driver 23 through the switch 24. The bit line/source line regulator 26 adjusts and outputs the voltage that is to be supplied, according to a control signal from the control circuit 28.

The word line regulator 27 is a voltage generation circuit that, during data write or read operation on a memory cell, supplies a voltage that is to be applied to a word line WL, to the word line driver 25, and adjusts and outputs the voltage that is to be supplied, according to a control signal from the control circuit 28.

The control circuit 28 is a circuit that controls various operation modes, such as data read or write operation on the memory array 10, cell transistor performance measuring operation described below, etc. The control circuit 28 controls the column gate 21, the sense amplifier 22, the write driver 23, the switch 24, the word line driver 25, the bit line/source line regulator 26, and the word line regulator 27.

The current measuring device 29 is a device that, during cell transistor performance measurement, supplies a voltage to a bit line BL or a source line SL through the switch 24, and measures a current through the switch 24.

Figure 6:
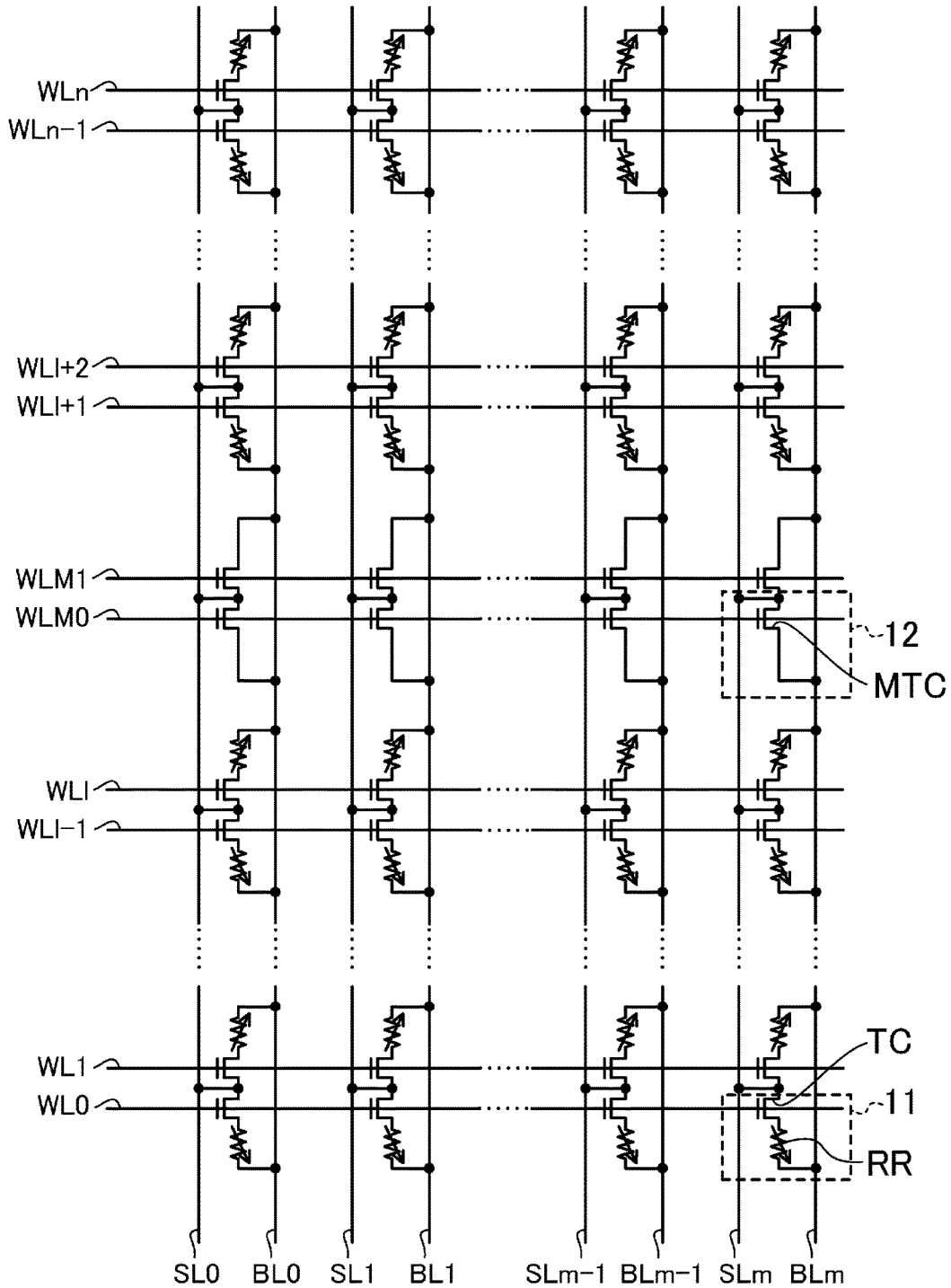
FIG. 6 is a diagram showing a detailed configuration of a memory array of the nonvolatile semiconductor storage device of the first embodiment of the present disclosure.

FIG. 6 is a diagram showing a detailed configuration of the memory array 10, which is a main portion of the nonvolatile semiconductor storage device of the first embodiment of the present disclosure. The memory array 10 of FIG. 6 includes a plurality of memory cells 11 arranged in a matrix, and cell transistor performance measuring cells 12.

The memory cell 11 includes a series connection of a variable resistance element RR and a cell transistor TC. Here, the variable resistance element RR is an element that can store data based on a change in the resistance value.

A word line WL which is provided, corresponding to the memory cells 11 in each row, is connected to the gates of the cell transistors TC included in the memory cells 11 in that row. A bit line BL which is provided, corresponding to the memory cells 11 in each column, is connected to an end of each of the variable resistance elements RR included in the memory cells 11 in that column. A source line SL which is provided, corresponding to the memory cells 11 in each column, is connected to an end of each of the cell transistors TC included in the memory cells 11 in that column.

Two cell transistor performance measuring cells 12 corresponding to two rows are connected to a bit line BL and a source line SL in each column. The cell transistor performance measuring cell 12 includes a MOS transistor MTC. The gates of the cell transistor performance measuring cells 12 in each row are connected to the cell transistor performance measuring word line WLM0 or WLM1. The drain and source of each of the cell transistor performance measuring cells 12 in each column are connected to a bit line BL and a source line SL, respectively, in that column.

Although, in this embodiment, the two cell transistor performance measuring cells 12 corresponding to two rows are provided in each column, at least one cell transistor performance measuring cell 12 may be provided. For example, one cell transistor performance measuring cell 12 may be provided, corresponding to only a single row or column.

FIG. 7A is a cross-sectional view of the memory cell 11 of this embodiment. FIG. 7B is a circuit diagram of the memory cell 11. In this embodiment, a resistive random access memory (ReRAM) device employing the variable resistance element RR is described as an example.

The memory cell 11 includes a series connection of the variable resistance element RR and the cell transistor TC. A word line WL is connected to the gate of the cell transistor TC. A bit line BL is connected to the variable resistance element RR. A source line SL is connected to the source terminal of the cell transistor TC.

Although, in this embodiment, it is assumed that the variable resistance element RR is connected to the bit line BL and the cell transistor TC is connected to the source line SL, the cell transistor TC may be connected to the bit line BL and the variable resistance element RR may be connected to the source line SL. In other words, the memory cell of this embodiment is a so-called 1T1R resistive memory cell which includes a single cell transistor TC and a single variable resistance element RR.

In the memory cell 11, diffusion regions 61a and 61b are formed on a semiconductor substrate 60. The diffusion region 61a functions as the source terminal of the cell transistor TC, and the diffusion region 61b functions as the drain terminal of the cell transistor TC. The channel region of the cell transistor TC is located between the diffusion regions 61a and 61b. An oxide film 62, and a gate electrode 63 of, for example, polysilicon, are formed on the channel region. The oxide film 62 and the gate electrode 63 function as the word line WL. The cell transistor TC is thus configured.

The diffusion region 61a as the source terminal of the cell transistor TC is connected to the source line SL, which is a first interconnection layer 65a, through a via 64a. The diffusion region 61b as the drain terminal is connected to a first interconnection layer 65b through a via 64b. The first interconnection layer 65b is connected to a second interconnection layer 67 through a via 66. The second interconnection layer 67 is connected to the variable resistance element RR through a via 68.

The variable resistance element RR includes a lower electrode 69, a variable resistance layer 70, and an upper electrode 71. The variable resistance element RR is connected to the bit line BL, which is a third interconnection layer 73, through a via 72.

FIG. 8A is a cross-sectional view of the cell transistor performance measuring cell 12 of this embodiment. FIG. 8B is a circuit diagram of the cell transistor performance measuring cell 12.

The cell transistor performance measuring cell 12 includes a MOS transistor MTC. The cell transistor performance measuring word line WLM is connected to the gate of the MOS transistor MTC. The bit line BL is connected to the drain of the MOS transistor MTC. The source line SL is connected to the source of the MOS transistor MTC.

In the cell transistor performance measuring cell 12, the gate electrode 63 of the MOS transistor MTC formed on the semiconductor substrate 60 operates as the cell transistor performance measuring word line WLM. The second interconnection layer 67 is connected to the bit line BL, which is the third interconnection layer 73, through a via 74. The other configuration is similar to that of the memory cell 11 described in FIGS. 7A and 7B.

Note that the MOS transistor MTC and the cell transistor TC desirably have the same gate length and gate width. Also, the MOS transistor MTC and the cell transistor TC desirably have the same thickness of the oxide film 62.

Next, operation of the nonvolatile semiconductor storage device of this embodiment will be described with reference to FIGS. 5 and 9.

Figure 9:
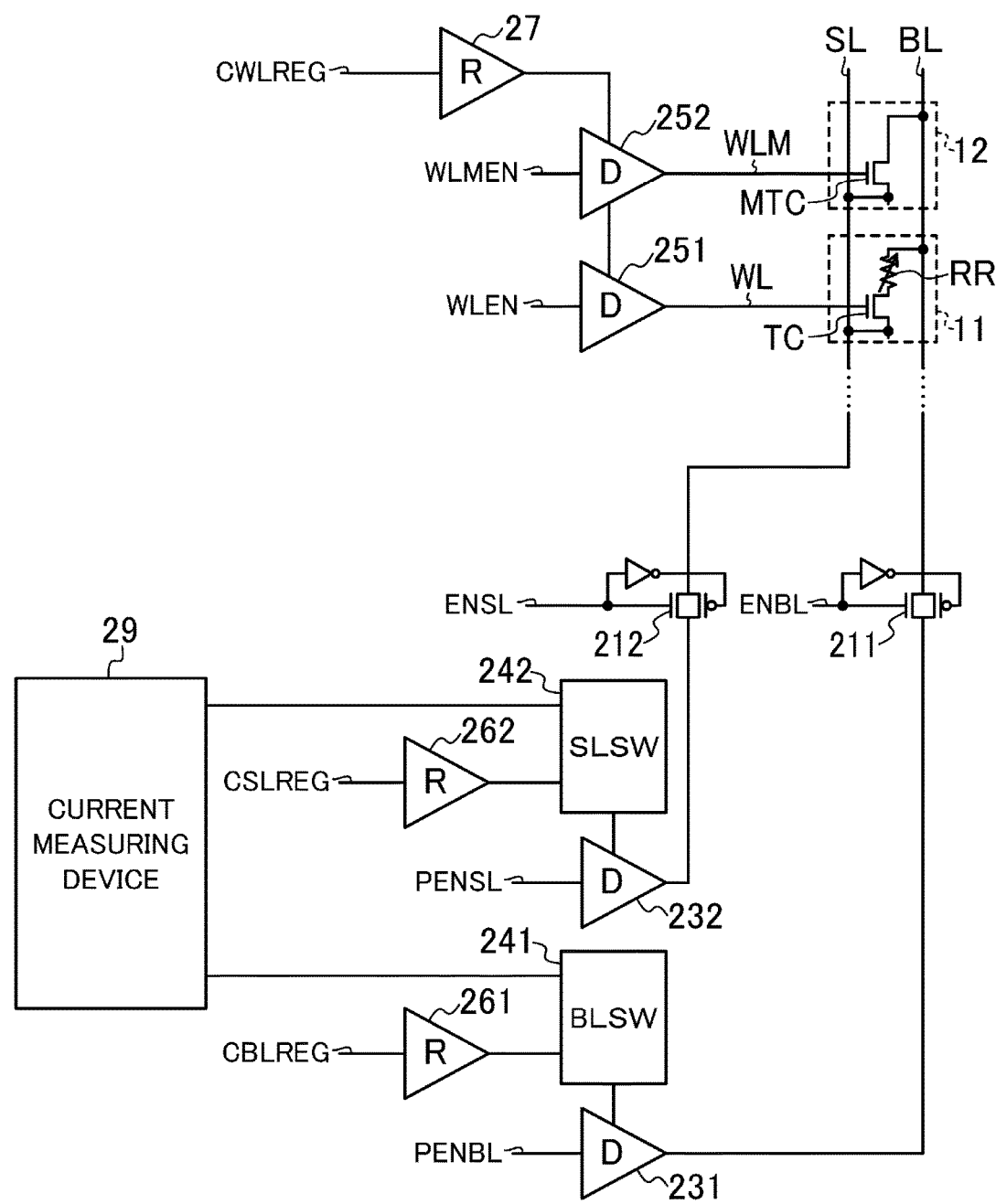
FIG. 9 is a circuit diagram showing a schematic configuration of the nonvolatile semiconductor storage device of the first embodiment of the present disclosure.

FIG. 9 is a diagram showing a circuit that is a portion of the overall configuration of the nonvolatile semiconductor storage device of FIG. 5, for describing operation of the present disclosure. FIG. 9 does not show the sense amplifier 22 or the control circuit 28 of FIG. 5. As a representative of a plurality of word lines, a plurality of bit lines, a plurality of source lines, and a plurality of cell transistor performance measuring word lines that are provided in the memory array 10 of FIG. 6, a single word line WL, bit line BL, source line SL, and cell transistor performance measuring word line WLM are shown.

In FIG. 9, the bit line BL and the source line SL of the memory cell 11 and the cell transistor performance measuring cell 12 are connected to a gate 211 and a gate 212, respectively, provided in the column gate 21. When control signals ENBL and ENSL from the control circuit 28 go high, a BL driver 231 and an SL driver 232 that are provided in the write driver 23 are connected to the gate 211 and the gate 212, respectively. The word line WL and the cell transistor performance measuring word line WLM are connected to a WL driver 251 and a WLM driver 252, respectively, that are provided in the word line driver 25.

The BL driver 231 receives, as power supply, a voltage supplied from a BL switch 241 provided in the switch 24. When a control signal PENBL from the control circuit 28 is high, the BL driver 231 outputs the voltage supplied from the BL switch 241. When the control signal PENBL is low, the BL driver 231 outputs the ground voltage.

The SL driver 232 receives, as power supply, a voltage supplied from an SL switch 242 provided in the switch 24. When a control signal PENSL from the control circuit 28 is high, the SL driver 232 outputs the voltage supplied from the SL switch 242. When the control signal PENSL is low, the SL driver 232 outputs the ground voltage.

The BL switch 241 is a switch circuit that supplies, to the BL driver 231, an output voltage of a BL regulator 261 provided in the bit line/source line regulator 26 during write operation, and an output voltage of the current measuring device 29 during cell transistor performance measuring operation.

The SL switch 242 is a switch circuit that supplies, to the SL driver 232, an output voltage of the SL regulator 262 provided in the bit line/source line regulator 26 during write operation, and an output voltage of the current measuring device 29 during cell transistor performance measuring operation.

The WL driver 251 receives, as power supply, a voltage supplied from the word line regulator 27. When a control signal WLEN from the control circuit 28 is high, the WL driver 251 outputs the voltage supplied from the word line regulator 27. When the control signal WLEN is low, the WL driver 251 outputs the ground voltage. The WL driver 251 thus drives the word line WL.

The WLM driver 252 receives, as power supply, a voltage supplied from the word line regulator 27. When a control signal WLMEN from the control circuit 28 is high, the WLM driver 252 outputs the voltage supplied from the word line regulator 27. When the control signal WLMEN is low, the WLM driver 252 outputs the ground voltage. The WLM driver 252 thus drives the cell transistor performance measuring word line WLM.

The BL regulator 261 adjusts and outputs a bit line voltage value for write operation to the BL switch 241 according to a control signal CBLREG from the control circuit 28.

The SL regulator 262 adjusts and outputs a source line voltage value for write operation to the SL switch 242 according to a control signal CSLREG from the control circuit 28.

The word line regulator 27 adjusts and outputs a word line voltage value for write operation to the WL driver 251 and the WLM driver 252 according to a control signal CWLREG from the control circuit 28.

Write operation that is performed using this configuration will now be overviewed. Initially, in a cell transistor performance measurement mode, a predetermined bias is applied to the cell transistor performance measuring cell 12 so that current measurement is performed. Based on the result of the current measurement, values of voltages that are to be applied to the word line WL, the bit line BL, and the source line SL during write operation are determined and stored. Write operation is performed using voltages that are obtained by adjusting the outputs of the BL regulator 261, the SL regulator 262, and the word line regulator 27 to the stored voltage values. Detailed operation will now be described with reference to FIG. 10.

FIG. 10 shows a biased state of the cell transistor performance measuring cell 12 during current measurement.

The current measurement of the cell transistor performance measurement mode is performed during, for example, testing of the nonvolatile semiconductor storage device of FIG. 5 on a wafer after completion of the manufacturing process.

During program operation in which the variable resistance element RR is caused to be in the high resistance state, the output of the word line regulator 27 is adjusted to a WLM voltage Vg_resetm (e.g., 2.4 V) as a setting for providing a program voltage according to the control signal CWLREG in the cell transistor performance measurement mode. For example, the current measuring device 29, which is a semiconductor testing device for use in a testing step, outputs a bit line voltage Vresetm (e.g., 2.4 V) as a setting for providing a program voltage.

Next, the control signal WLMEN to the WLM driver 252 is caused to go high, so that the cell transistor performance measuring word line WLM is at Vg_resetm, and therefore, the MOS transistor MTC of the cell transistor performance measuring cell 12 is in the conducting state. At this time, the control signal WLEN is caused to go low, so that 0 V is applied to the word line WL, and therefore, the cell transistor TC is cut off.

The BL switch 241 supplies the output voltage Vresetm of the current measuring device 29, as power supply, to the BL driver 231.

The control signal ENBL to the gate 211 is caused to go high, and the control signal ENSL to the gate 212 is caused to go high, so that the bit line BL is connected to the output of the BL driver 231, and the source line SL is connected to the output of the SL driver 232.

The control signal PENBL to the BL driver 231 is caused to go high, and the control signal PENSL to the SL driver 232 is caused to go low, so that Vresetm is applied to the bit line BL, and the ground voltage VSS (=0 V) is applied to the source line SL.

The above operation allows the voltages shown as the "settings for providing program voltage" of FIG. 10 to be applied to the terminals of the cell transistor performance measuring cell 12, so that a current flows through the cell transistor performance measuring cell 12.

This current is measured using the current measuring device 29. If the current has a predetermined value or more, it can be determined that the threshold voltage of the cell transistor performance measuring cell 12 is low due to manufacturing variations. Here, if the cell transistor TC included in the memory cell 11 and the MOS transistor MTC of the cell transistor performance measuring cell 12 have the same characteristics, it can be determined that the threshold voltage of the cell transistor TC is also low. In this case, it can be determined that it is optimal to set the voltages applied to the word line WL and the bit line BL during program operation to be lower than Vg_resetm and Vresetm, and the optimal voltage values are determined to be Vg_reseta and Vreseta, respectively. Conversely, if the current has a predetermined value or less, it can be determined that the threshold voltage of the cell transistor performance measuring cell 12 is high due to manufacturing variations. In this case, it can be determined that the threshold voltage of the cell transistor TC is also high, and it is optimal to set the voltages applied to the word line WL and the bit line BL during program operation to be higher than Vg_resetm and Vresetm, and the optimal voltage values are determined to be Vg_reseta and Vreseta, respectively.

Here, data indicating the voltage values thus determined is stored in the adjustment value storage area 20 provided in the memory array 10. The adjustment value storage area 20 includes a portion of the memory cells in the memory array 10 for storing data.

During erase operation in which the variable resistance element RR is caused to be in the low resistance state, the output of the word line regulator 27 is adjusted to the WLM voltage Vg_setm (e.g., 2.4 V) as a setting for providing an erase voltage according to the control signal CWLREG in the cell transistor performance measurement mode. The current measuring device 29 outputs a source line voltage Vsetm (e.g., 2.4 V) as a setting for providing an erase voltage.

Next, the control signal WLMEN to the WLM driver 252 is caused to go high, so that the cell transistor performance measuring word line WLM is at Vg_setm, and therefore, the MOS transistor MTC of the cell transistor performance measuring cell 12 is in the conducting state. At this time, the control signal WLEN is caused to go low, so that 0 V is applied to the word line WL, and therefore, the cell transistor TC is cut off.

The SL switch 242 supplies the output voltage Vsetm of the current measuring device 29, as power supply, to the SL driver 232.

The control signal ENBL to the gate 211 is caused to go high, and the control signal ENSL to the gate 212 is caused to go high, so that the bit line BL is connected to the output of the BL driver 231, and the source line SL is connected to the output of the SL driver 232.

The control signal PENBL to the BL driver 231 is caused to go low, and the control signal PENSL to the SL driver 232 is caused to go high, so that the ground voltage VSS is applied to the bit line BL, and Vsetm is applied to the source line SL.

The above operation allows the voltages shown as the "settings for providing erase voltage" of FIG. 10 to be applied to the terminals of the cell transistor performance measuring cell 12, so that a current flows through the cell transistor performance measuring cell 12.

This current is measured using the current measuring device 29. If the current has a predetermined value or more, it can be determined that the threshold voltage of the cell transistor performance measuring cell 12 is low due to manufacturing variations. As during program operation, it can be determined that the threshold voltage of the cell transistor is also low. In this case, it can be determined that it is optimal to set the voltages applied to the word line WL and the bit line BL during erase operation to be lower, and the optimal voltage voltages are determined to be Vg_seta and Vseta, respectively. Conversely, if the current has a predetermined value or less, it can be determined that the threshold voltage of the cell transistor performance measuring cell 12 is high due to manufacturing variations. In this case, it can be determined that the threshold voltage of the cell transistor TC is also high, and it is optimal to set the voltages applied to the word line WL and the source line SL during erase operation to be higher, and the optimal voltage voltages are determined to be Vg_seta and Vseta, respectively.

Here, the voltage values thus determined are stored in the adjustment value storage area 20 provided in the memory array 10.

FIG. 11 shows the optimal voltage values during program operation and erase operation that are determined by the above techniques. Different optimal voltage values are set for different nonvolatile semiconductor storage devices. The subsequent write operation is performed under these voltage conditions.

Write operation of the memory cell 11 will now be described.

During program operation, the optimal program voltage values Vg_reseta and Vreseta stored in the adjustment value storage area 20 are read out, and based on the result, the control circuit 28 sets the control signal CWLREG to allow the word line regulator 27 to output Vg_reseta, and the word line regulator 27 outputs Vg_reseta.

The control circuit 28 sets the control signal CBLREG to allow the BL regulator 261 to output Vreseta, and the BL regulator 261 outputs Vreseta.

Next, the control signal WLEN to the WL driver 251 is caused to go high, so that the word line WL is at Vg_reseta, and therefore, the cell transistor TC is in the conducting state. At this time, the control signal WLMEN is caused to go low, so that 0 V is applied to the cell transistor performance measuring word line WLM, and therefore, the MOS transistor MTC of the cell transistor performance measuring cell 12 is cut off. The BL switch 241 supplies the output voltage Vreseta of the BL regulator 261, as power supply, to the BL driver 231.

The control signal ENBL to the gate 211 is caused to go high, and the control signal ENSL to the gate 212 is caused to go high, so that the bit line BL is connected to the output of the BL driver 231, and the source line SL is connected to the SL driver 232.

The control signal PENBL to the BL driver 231 is caused to be high during a predetermined period of time (e.g., 10 ns), and the control signal PENSL to the SL driver 232 is caused to go low, so that the program bit line voltage Vreseta in a pulsed form is applied to the bit line BL while the ground voltage VSS is applied to the source line SL, and therefore, the variable resistance element RR is caused to be in the high resistance state.

During erase operation, the optimal erase voltage values Vg_seta and Vseta stored in the adjustment value storage area 20 are read out, and the control circuit 28 sets the control signal CWLREG to allow the word line regulator 27 to output Vg_seta, and the word line regulator 27 outputs Vg_seta.

The control circuit 28 also sets the control signal CSL-REG to allow the SL regulator 262 to output Vseta, and the SL regulator 262 outputs Vseta.

Next, the control signal WLEN to the WL driver 251 is caused to go high, so that the word line WL is at Vg_seta, and therefore, the cell transistor is in the conducting state. At this time, the control signal WLMEN is caused to go low, so that 0 V is applied to the cell transistor performance measuring word line WLM, and therefore, the MOS transistor MTC of the cell transistor performance measuring cell 12 is cut off.

The SL switch 242 supplies the output voltage Vseta of the SL regulator 262 as power supply to the SL driver 232.

The control signal ENBL to the gate 211 is caused to go high, and the control signal ENSL to the gate 212 is caused to go high, so that the bit line BL is connected to the output of the BL driver 231, and the source line SL is connected to the output of the SL driver 232.

The control signal PENBL to the SL driver 232 is caused to be high during a predetermined period of time (e.g., 10 ns), and the control signal PENSL to the BL driver 231 is caused to go low, so that the erase source line voltage Vseta in a pulsed form is applied to the source line SL while the ground voltage VSS is applied to the bit line BL, and therefore, the variable resistance element RR is caused to be in the low resistance state.

By the above configuration and write operation, a predetermined voltage can be applied to the variable resistance element RR during write operation irrespective of manufacturing variations in the threshold voltage of the cell transistor TC. This allows for stabilization of the resistance values in the low and high resistance states, and therefore, read operation characteristics and reliability characteristics can be improved.

Second Embodiment

Figure 12:
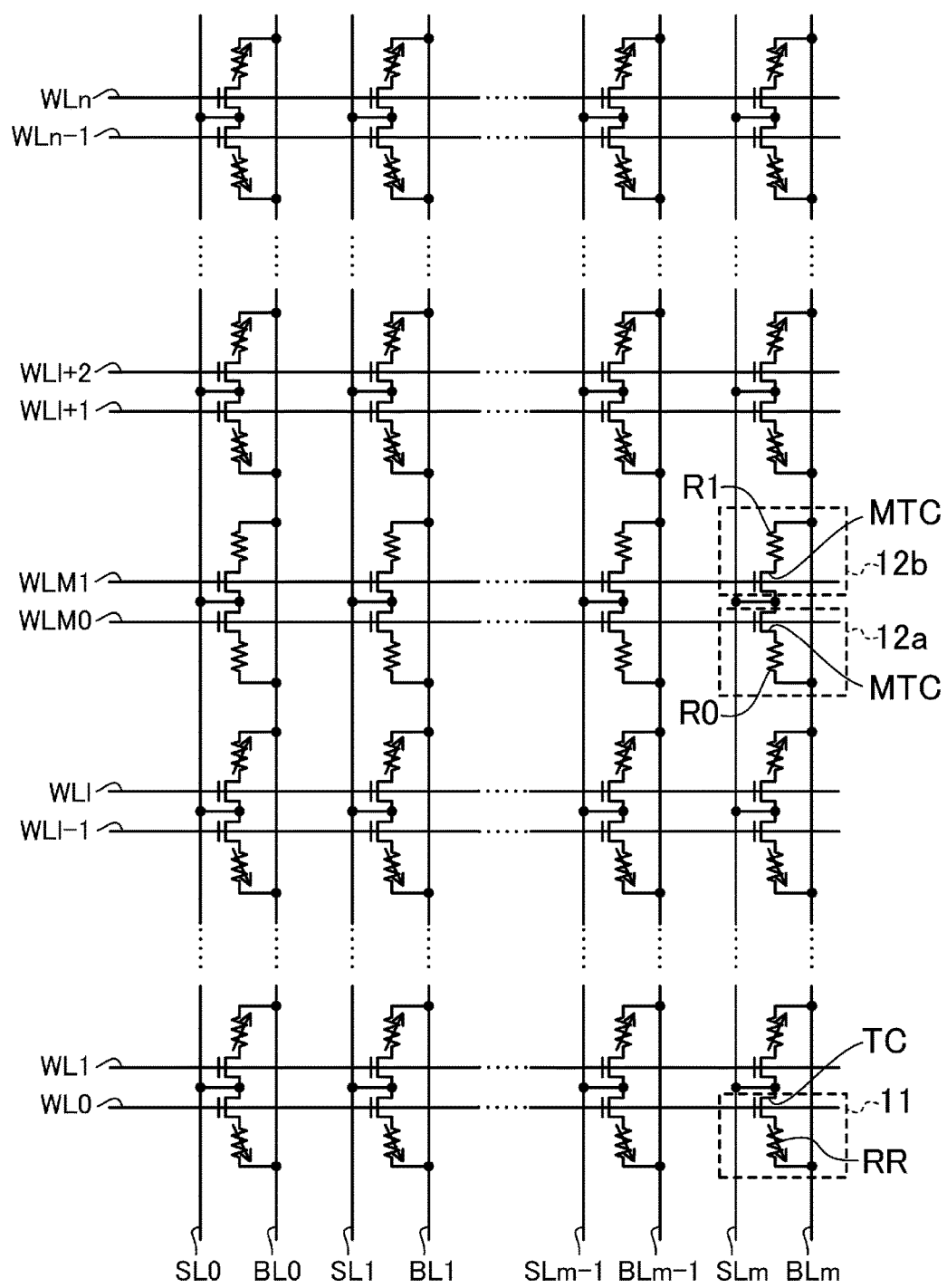
FIG. 12 is a diagram showing a detailed configuration of a memory array which is a main portion of a nonvolatile semiconductor storage device according to a second embodiment of the present disclosure.

FIG. 12 is a diagram showing a detailed configuration of a memory array which is a main portion of a nonvolatile semiconductor storage device according to a second embodiment of the present disclosure. Differences between the first and second embodiments will now be mainly described.

The memory array 10 includes cell transistor performance measuring cells including program cell transistor performance measuring cells 12a and erase cell transistor performance measuring cells 12b.

The program cell transistor performance measuring cell 12a includes a series connection of a MOS transistor MTC and a fixed resistor R0 that is formed of, for example, polysilicon. The gate of the MOS transistor MTC is connected to a cell transistor performance measuring word line WLM0. A bit line BL is connected to an end of the fixed resistor R0. A source line SL is connected to an end of the MOS transistor MTC. The fixed resistor R0 has a resistance value (e.g., 100 kΩ) equal to a resistance value of a memory cell after program operation to the memory cell.

The erase cell transistor performance measuring cell 12b includes a series connection of a MOS transistor MTC and a fixed resistor R1. The gate of the MOS transistor MTC is connected to a cell transistor performance measuring word line WLM1. A bit line BL is connected to an end of the fixed resistor R1. A source line SL is connected to an end of the MOS transistor MTC. The fixed resistor R1 has a resistance value (e.g., 10 kΩ) equal to a resistance value of a memory cell after erase operation to the memory cell.

The MOS transistor MTC desirably has the same gate length, gate width, and oxide film thickness as those of the cell transistor TC.

Next, operation of the nonvolatile semiconductor storage device of this embodiment will be described with reference to FIGS. 5 and 13.

Figure 13:
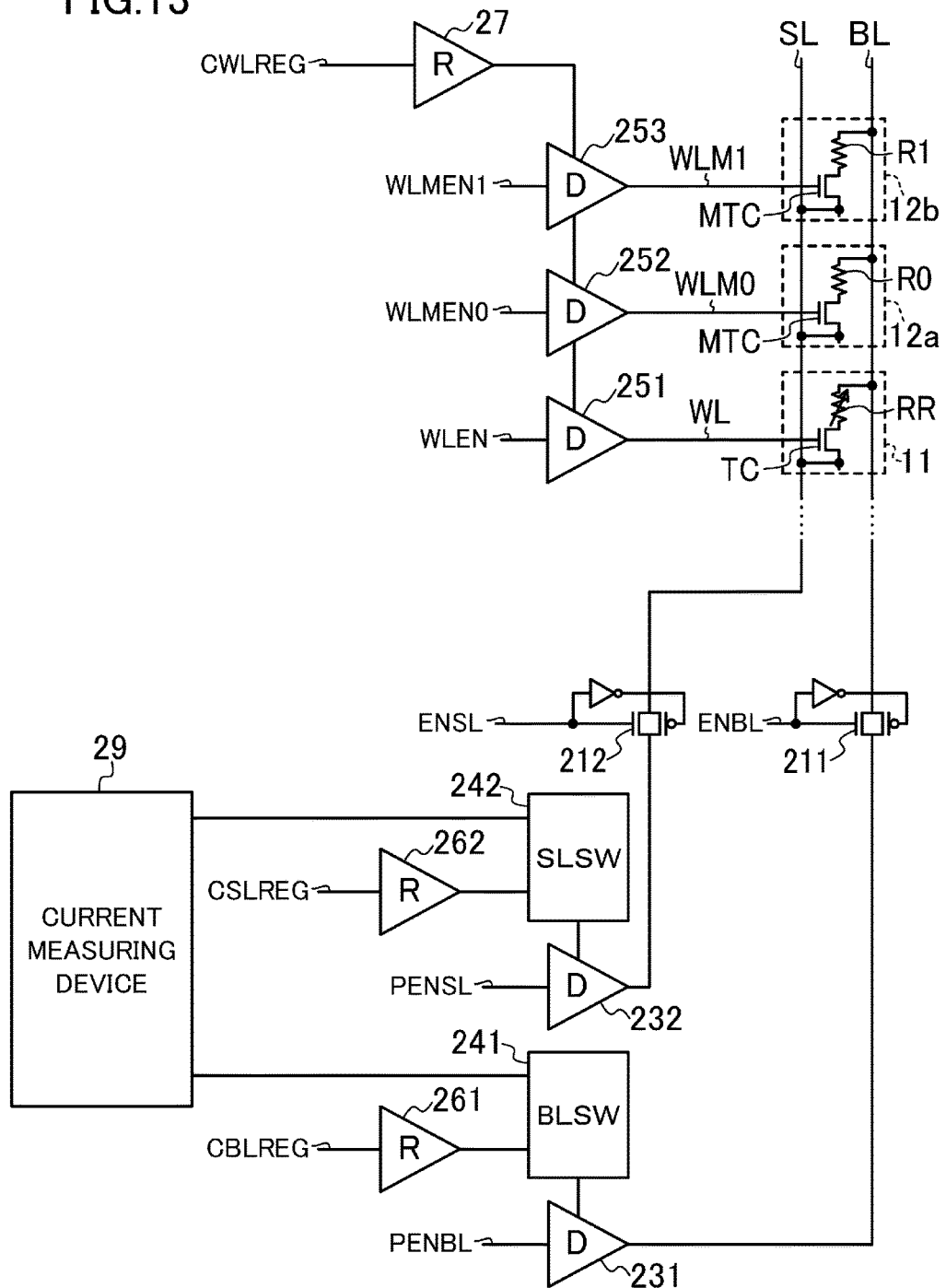
FIG. 13 is a circuit diagram showing a schematic configuration of the nonvolatile semiconductor storage device of the second embodiment of the present disclosure.

FIG. 13 is a diagram showing a circuit that is a portion of the overall configuration of the nonvolatile semiconductor storage device of FIG. 5, for describing operation of the present disclosure. FIG. 13 does not show the sense amplifier 22 or the control circuit 28 of FIG. 5. As a representative of a plurality of word lines, a plurality of bit lines, a plurality of source lines, and a plurality of cell transistor performance measuring word lines that are provided in the memory array 10 of FIG. 12, a single word line WL, bit line BL, and source line SL, and two cell transistor performance measuring word lines WLM0 and WLM1 are shown.

In FIG. 13, the bit line BL and the source line SL of the memory cell 11, the program cell transistor performance measuring cell 12a, and the erase cell transistor performance measuring cell 12b are connected to a gate 211 and a gate 212, respectively, provided in the column gate 21. The cell transistor performance measuring word lines WLM0 and WLM1 are connected to a WLM driver 252 and a WLM driver 253, respectively, provided in the word line driver 25.

The WLM driver 252 receives, as power supply, a voltage supplied from the word line regulator 27. When a control signal WLMEN0 from the control circuit 28 is high, the WLM driver 252 outputs the voltage supplied from the word line regulator 27. When the control signal WLMEN0 is low, the WLM driver 252 outputs the ground voltage. The WLM driver 252 thus drives the cell transistor performance measuring word line WLM0.

The WLM driver 253 also receives, as power supply, a voltage supplied from the word line regulator 27. When a control signal WLMEN1 from the control circuit 28 is high, the WLM driver 253 outputs the voltage supplied from the word line regulator 27. When the control signal WLMEN1 is low, the WLM driver 253 outputs the ground voltage. The WLM driver 253 thus drives the cell transistor performance measuring word line WLM1.

Write operation that is performed using this configuration will now be overviewed. As in the first embodiment, initially, in the cell transistor performance measurement mode, a predetermined bias is applied to the cell transistor performance measuring cells 12a and 12b so that current measurement is performed. Based on the result of the current measurement, values of voltages that are to be applied to the word line WL, the bit line BL, and the source line SL during write operation are determined and stored. Write operation is performed using voltages that are obtained by adjusting the outputs of the BL regulator 261, the SL regulator 262, and the word line regulator 27 to the stored voltage values. Detailed operation will now be described with reference to FIG. 10.

During program operation in which the variable resistance element RR is caused to be in the high resistance state, the output of the word line regulator 27 is adjusted to a WLM voltage Vg_resetm (e.g., 2.4 V) as a setting for providing a program voltage according to a control signal CWLREG in the cell transistor performance measurement mode as in the first embodiment. For example, the current measuring device 29 outputs a bit line voltage Vresetm (e.g., 2.4 V) as a setting for providing a program voltage.

Next, the control signal WLMEN0 to the WLM driver 252 is caused to go high, so that the cell transistor performance measuring word line WLM0 is at Vg_setm, and therefore, the MOS transistor MTC of the cell transistor performance measuring cell 12a is in the conducting state.

At this time, the control signals WLEN and WLMEN1 are caused to go low, so that the cell transistor TC and the MOS transistor MTC of the erase cell transistor performance measuring cell 12b are cut off.

The control of the BL switch 241, the gate 211, the gate 212, the BL driver 231, and the SL driver 232 is similar to that which is performed when a program voltage is determined in the first embodiment, and therefore, will not be described.

The above operation allows the voltages shown as the "settings for providing program voltage" of FIG. 10 to be applied to the terminals of the program cell transistor performance measuring cell 12a, so that a current flows through the program cell transistor performance measuring cell 12a.

This current is measured using the current measuring device 29. The optimal voltage values Vg_reseta and Vreseta are determined based on the value of the current, and then stored to the adjustment value storage area 20, using a technique similar to that of the first embodiment.

In this embodiment, the fixed resistor R0 having a resistance value equal to the resistance value of the memory cell after program operation to the memory cell is provided in the program cell transistor performance measuring cell 12a. Therefore, the drain-source voltage of the MOS transistor MTC can be caused to be similar to that of the cell transistor TC during program operation of the memory cell 11. As a result, threshold voltage characteristics of the cell transistor during actual program operation can be more accurately predicted than in the first embodiment, leading to an improvement in accuracy of optimization of a voltage value.

During erase operation in which the variable resistance element RR is caused to be in the low resistance state, the output of the word line regulator 27 is adjusted to a WLM voltage Vg_setm (e.g., 2.4 V) as a setting for providing an erase voltage according to the control signal CWLREG in the cell transistor performance measurement mode as in the first embodiment. The current measuring device 29 outputs an SL voltage Vsetm (e.g., 2.4 V) as a setting for providing an erase voltage.

Next, the control signal WLMEN1 to the WLM driver 253 is caused to go high, so that the cell transistor performance measuring word line WLM1 is at Vg_resetm, and therefore, the MOS transistor MTC of the erase cell transistor performance measuring cell 12b is in the conducting state.

At this time, the control signals WLEN and WLMEN0 are caused to go low, so that the cell transistor TC and the MOS transistor MTC of the program cell transistor performance measuring cell 12a are cut off.

The control of the BL switch 241, the gate 211, the gate 212, the BL driver 231, and the SL driver 232 is similar to that which is performed when an erase voltage is determined in the first embodiment, and therefore, will not be described.

The above operation allows the voltages shown as the "settings for providing erase voltage" of FIG. 10 to be applied to the terminals of the erase cell transistor performance measuring cell 12b, so that a current flows through the erase cell transistor performance measuring cell 12b.

This current is measured using the current measuring device 29. The optimal voltage values Vg_seta and Vseta are determined based on the value of the current, and then stored to the adjustment value storage area 20, using a technique similar to that of the first embodiment.

In this embodiment, the fixed resistor R1 having a resistance value equal to the resistance value of the memory cell after erase operation to the memory cell is provided in the erase cell transistor performance measuring cell 12b. Therefore, by the fixed resistor R1, the gate-source voltage (the source refers to one of the drain and source of the transistor MTC that has a lower voltage value) of the MOS transistor MTC can be caused to be similar to that of the cell transistor TC during erase operation of the memory cell 11. As a result, threshold voltage characteristics of a cell transistor can be more accurately predicted than in the first embodiment, leading to an improvement in accuracy of optimization of a voltage value.

In particular, during erase operation, the source of the cell transistor TC has a voltage that is higher than 0 V due to a voltage drop that is caused by a current flowing through the resistance of the variable resistance element RR. As a result, the threshold voltage of the cell transistor can be accurately predicted using this embodiment, taking the substrate bias effect into account, irrespective of a change in the threshold voltage of the cell transistor TC due to the substrate bias effect.

During write operation of the memory cell 11, when the WL driver 251 is selected using WLEN that is high, the control signals WLMEN0 and WLMEN1 are caused to be low. Program operation and erase operation of the memory cell 11 are similar to those of the first embodiment, except that the MOS transistor MTC of each of the program cell transistor performance measuring cell 12a and the erase cell transistor performance measuring cell 12b is cut off.

By the above configuration and write operation, a predetermined voltage can be applied to the variable resistance element during write operation irrespective of manufacturing variations in the threshold voltage of the cell transistor. This allows for stabilization of the resistance values in the low and high resistance states, and therefore, read operation characteristics and reliability characteristics can be improved.

Third Embodiment

Figure 14:
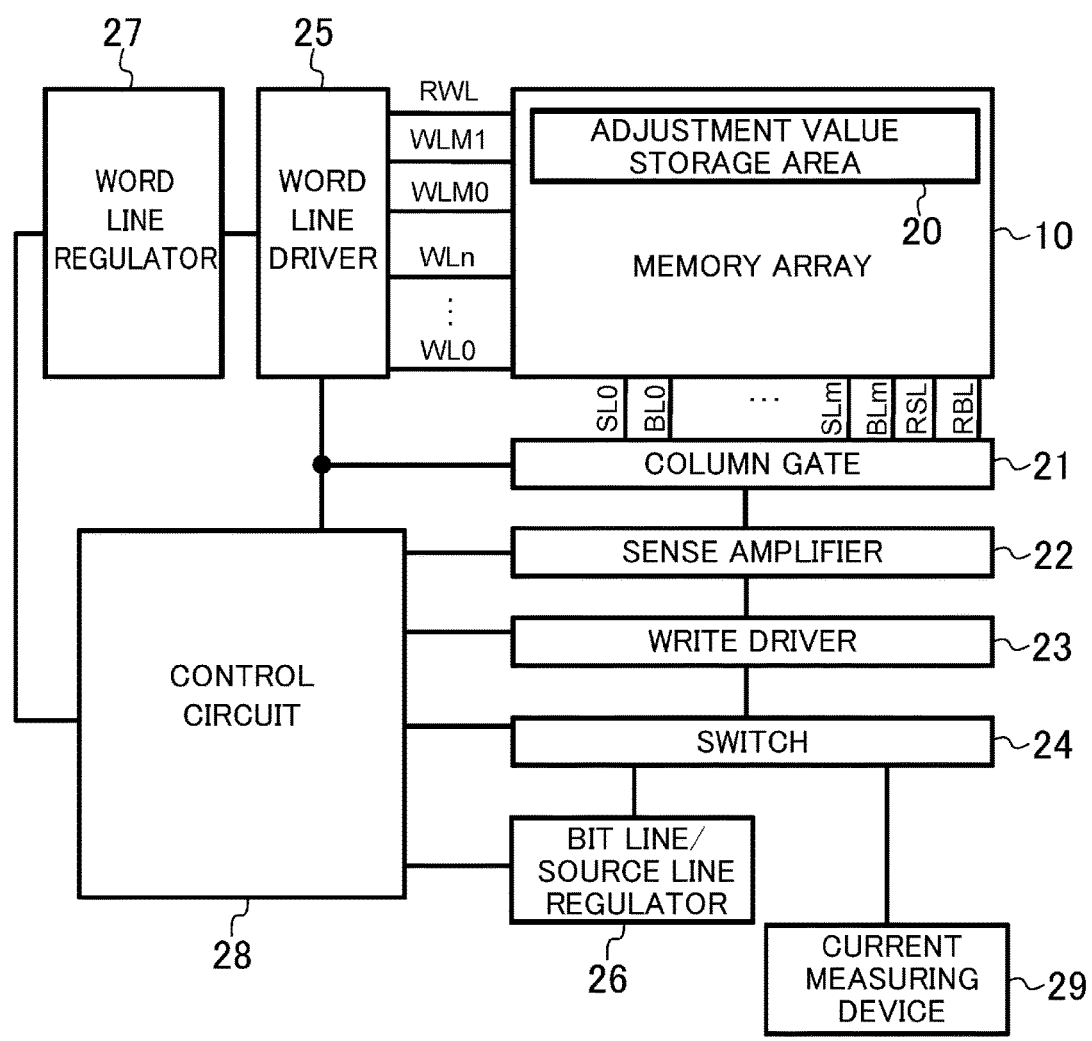
FIG. 14 is a diagram showing an overall configuration of a nonvolatile semiconductor storage device according to a third embodiment of the present disclosure.

FIG. 14 is a diagram showing a nonvolatile semiconductor storage device according to a third embodiment of the present disclosure and a current measuring device provided external to the nonvolatile semiconductor storage device. Differences from the first and second embodiments will now be mainly described.

A memory array 10 includes a plurality of word lines WL0-WLn, a plurality of bit lines BL0-BLm, a plurality of source lines SL0-SLm, and cell transistor performance measuring word lines WLM0 and WLM1 as in the first embodiment, and in addition, a reference word line RWL, a reference bit line RBL, and a reference source line RSL.

A column gate 21 is a circuit that selects and connects a bit line BL and a source line SL to the sense amplifier 22 or the write driver 23, and receives a control signal (not shown), and selects and connects the reference bit line RBL and the reference source line RSL to the sense amplifier 22 or the write driver 23 according to the control signal.

A word line driver 25 is a circuit that selects and drives a word line WL and the cell transistor performance measuring word line WLM, and in addition, receives a control signal (not shown) and drives the reference word line RWL according to the control signal.

Figure 15:
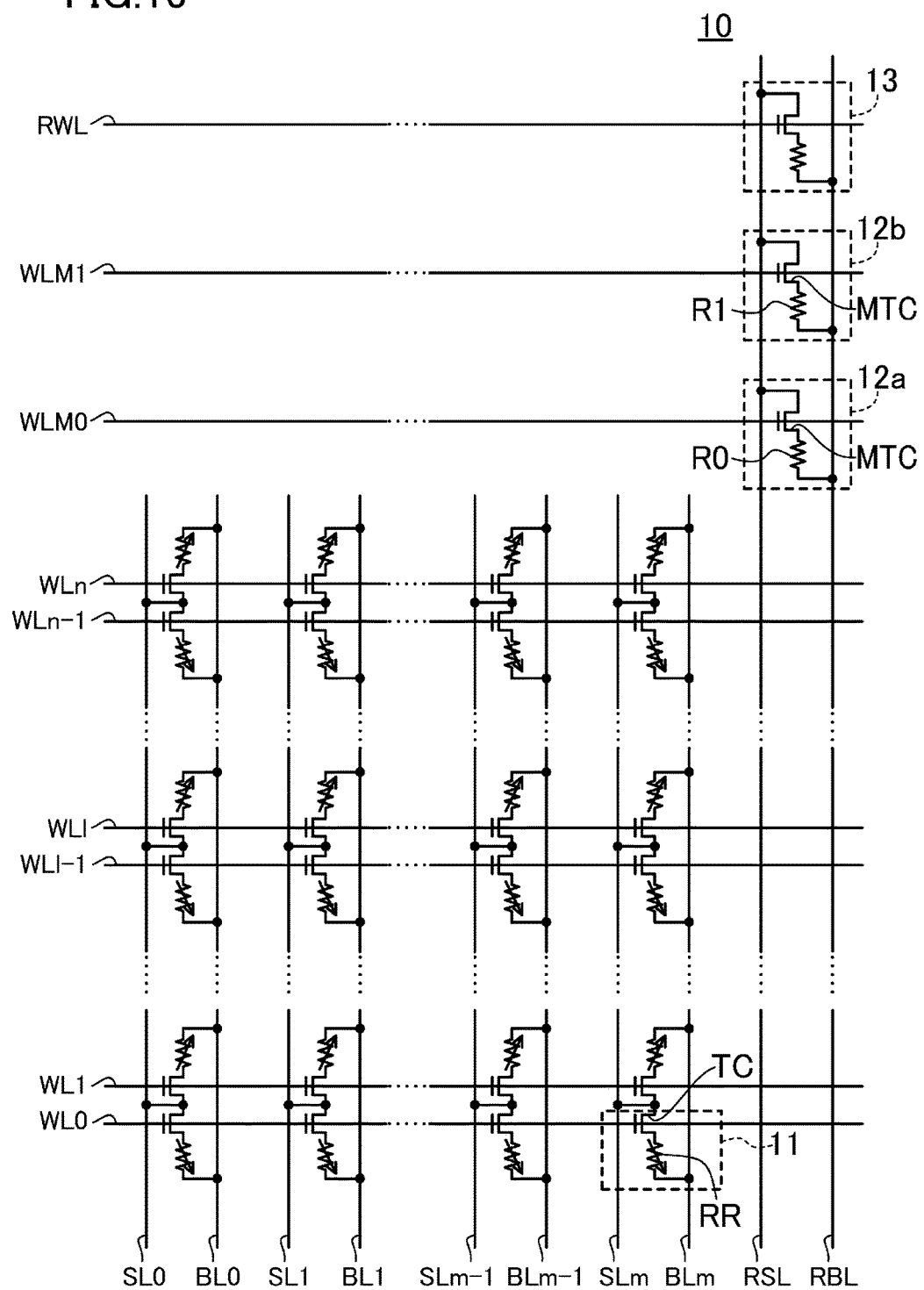
FIG. 15 is a diagram showing a detailed configuration of a memory array which is a main portion of the nonvolatile semiconductor storage device of the third embodiment of the present disclosure.

FIG. 15 is a diagram showing a detailed configuration of the memory array 10, which is a main portion of the nonvolatile semiconductor storage device of the third embodiment of the present disclosure. The memory array 10 includes, in addition to a plurality of memory cells 11 arranged in a matrix, a reference cell 13 that generates a reference current when data is read from the memory cell 11, along with a program cell transistor performance measuring cell 12a and an erase cell transistor performance measuring cell 12b.

The reference cell 13 includes, for example, a series connection of a MOS transistor and a fixed resistor. The gate of the MOS transistor is the reference word line RWL. The reference bit line RBL is fixed to an end of the fixed resistor. The reference source line RSL is connected to an end of the MOS transistor.

The program cell transistor performance measuring cell 12a is similar to that of the second embodiment, except that the reference bit line RBL is connected to an end of the fixed resistor R0, and the reference source line RSL is connected to an end of the MOS transistor MTC.

The erase cell transistor performance measuring cell 12b is similar to that of the second embodiment, except that the reference bit line RBL is connected to an end of the fixed resistor R1, and the reference source line RSL is connected to an end of the MOS transistor MTC.

Next, operation of the nonvolatile semiconductor storage device of this embodiment will be described with reference to FIGS. 14 and 16.

Figure 16:
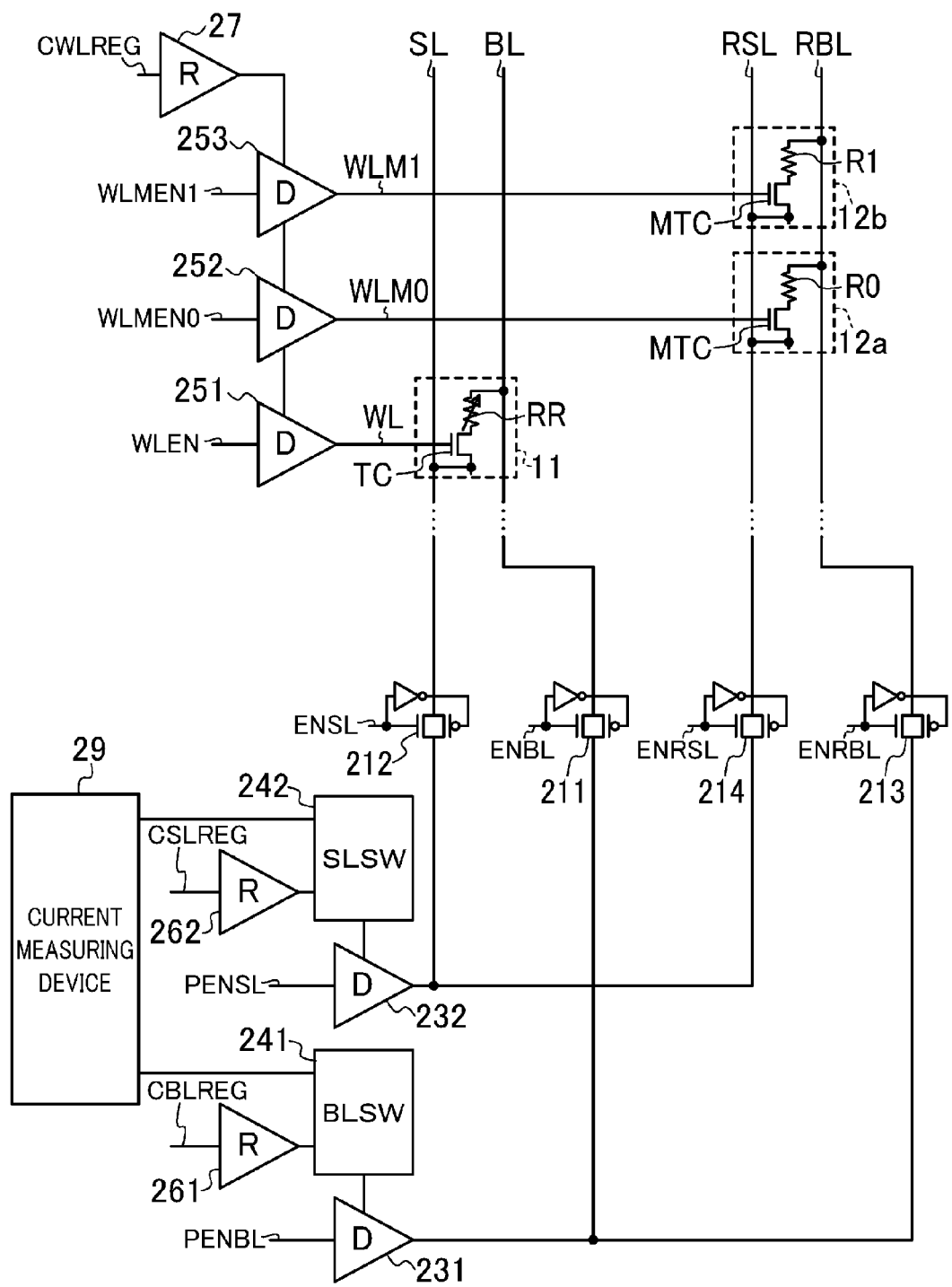
FIG. 16 is a circuit diagram showing a schematic configuration of the nonvolatile semiconductor storage device of the third embodiment of the present disclosure.

FIG. 16 is a diagram showing a circuit that is a portion of the overall configuration of the nonvolatile semiconductor storage device of FIG. 14, for describing operation of the present disclosure. FIG. 16 does not show the sense amplifier 22 or the control circuit 28 of FIG. 14. As a representative of a plurality of word lines, a plurality of bit lines, a plurality of source lines, and a plurality of cell transistor performance measuring word lines that are provided in the memory array 10 of FIG. 15, a single word line WL, bit line BL, and source line SL, and two cell transistor performance measuring word lines WLM0 and WLM1 are shown. The reference cell 13 and the reference word line RWL are not shown.

In FIG. 16, the bit line BL and the source line SL of the memory cell 11 are connected to a gate 211 and a gate 212, respectively, provided in the column gate 21. The reference bit line RBL and the reference source line RSL are connected to a gate 213 and a gate 214, respectively, provided in the column gate 21.

Transistors included in the gates 211 and 213 desirably the same gate length, gate width, and gate oxide film thickness. Transistors included in the gates 212 and 214 desirably have the same gate length, gate width, and gate oxide film thickness.

When control signals ENRBL and ENRSL to the gates 213 and 214, respectively, from the control circuit 28 go high, the reference bit line RBL and the reference source line RSL are connected to a BL driver 231 and an SL driver 232, respectively.

Write operation that is performed using this configuration is basically similar to that of the second embodiment. Initially, in the cell transistor performance measurement mode, a predetermined bias is applied to the cell transistor performance measuring cells 12a and 12b so that current measurement is performed. Based on the result of the current measurement, values of voltages that are to be applied to the word line WL, the bit line BL, and the source line SL during write operation are determined and stored. Write operation is performed using voltages that are obtained by adjusting the outputs of the BL regulator 261, the SL regulator 262, and the word line regulator 27 to the stored voltage values. Detailed operation will now be described with reference to FIG. 10.

During program operation in which the variable resistance element RR is caused to be in the high resistance state, the output of the word line regulator 27 is adjusted to a WLM voltage Vg_resetm (e.g., 2.4 V) as a setting for providing a program voltage according to a control signal CWLREG in the cell transistor performance measurement mode as in the first embodiment. For example, a current measuring device 29 outputs a bit line voltage Vresetm (e.g., 2.4 V) as a setting for providing a program voltage.

Next, a control signal WLMEN0 to a WLM driver 252 is caused to go high, so that the cell transistor performance measuring word line WLM0 is at Vg_resetm, and therefore, the MOS transistor MTC of the program cell transistor performance measuring cell 12a is in the conducting state. At this time, control signals WLEN and WLMEN1 are caused to go low, so that the cell transistor TC and the MOS transistor MTC of the erase cell transistor performance measuring cell 12b are cut off.

The control signal ENRBL to the gate 213 is caused to go high, and the control signal ENRSL to the gate 214 is caused to go high, so that the reference bit line RBL is connected to the output of the BL driver 231, and the reference source line RSL is connected to the output of the SL driver 232. At this time, the control signal ENBL to the gate 211 is caused to go low, and the control signal ENSL to the gate 212 is caused to go low, so that the bit line BL and the source line SL are not connected to the BL driver 231 and the SL driver 232, respectively.

The control of the BL switch 241, the BL driver 231, and the SL driver 232 is similar to that which is performed when a program voltage is determined in the second embodiment, and therefore, will not be described.

The above operation allows the voltages shown as the "settings for providing program voltage" of FIG. 10 to be applied to the terminals of the program cell transistor performance measuring cell 12a, so that a current flows through the program cell transistor performance measuring cell 12a.

This current is measured using the current measuring device 29. The optimal voltage values Vg_reseta and Vreseta are determined based on the value of the current, and then stored to the adjustment value storage area 20, using a technique similar to that of the first embodiment.

During erase operation in which the variable resistance element RR is caused to be in the low resistance state, the output of the word line regulator 27 is adjusted to a WLM voltage Vg_setm (e.g., 2.4 V) as a setting for providing an erase voltage according to the control signal CWLREG in the cell transistor performance measurement mode as in the first embodiment. The current measuring device 29 outputs an SL voltage Vsetm (e.g., 2.4 V) as a setting for providing an erase voltage.

Next, the control signal WLMEN1 to the WLM driver 253 is caused to go high, so that the cell transistor performance measuring word line WLM1 is at Vg_setm, and therefore, the MOS transistor MTC of the erase cell transistor performance measuring cell 12b is in the conducting state.

At this time, the control signals WLEN and WLMEN0 are caused to go low, so that the cell transistor TC and the MOS transistor MTC of the program cell transistor performance measuring cell 12a are cut off.

The control signal ENRBL to the gate 213 is caused to go high, and the control signal ENRSL to the gate 214 is caused to go high, so that the reference bit line RBL is connected to the output of the BL driver 231, and the reference source line RSL is connected to the output of the SL driver 232.

At this time, the control signal ENBL to the gate 211 is caused to go low, and the control signal ENSL to the gate 212 is caused to go low, so that the bit line BL and the source line SL are not connected to the BL driver 231 and the SL driver 232, respectively.

The control of the BL switch 241, the BL driver 231, and the SL driver 232 is similar to that which is performed when an erase voltage is determined in the second embodiment, and therefore, will not be described.

The above operation allows the voltages shown as the "settings for providing erase voltage" of FIG. 10 to be applied to the terminals of the erase cell transistor performance measuring cell 12b, so that a current flows through the program cell transistor performance measuring cell 12b.

This current is measured using the current measuring device 29. The optimal voltage values Vg_seta and Vseta are determined based on the value of the current, and then stored to the adjustment value storage area 20, using a technique similar to that of the first embodiment.

Write operation of the memory cell 11 is similar to the program operation and erase operation of the second embodiment, and therefore, will not be described.

Although, in this embodiment, the cell transistor performance measuring cells 12a and 12b include a series connection of a MOS transistor and a fixed resistor as in the second embodiment, the cell transistor performance measuring cells 12a and 12b may just include a MOS transistor as in the first embodiment.

In the first and second embodiments, in the memory array 10, the cell transistor performance measuring cells 12, 12a, and 12b are provided in the vicinity of the memory cell 11. In this case, to allow the variable resistance elements RR or metal interconnects to have a uniform pattern, it is necessary to provide a dummy pattern in a boundary between the memory cell 11 and the cell transistor performance measuring cells 12, 12a, and 12b, leading to an increase in memory array area. However, in the third embodiment, the cell transistor performance measuring cells 12a and 12b are provided in a region of the memory array 10 where the reference cell 13 is provided, and therefore, the increase in the area of the memory array 10 can be reduced or prevented.

By the above configuration and write operation, a predetermined voltage can be applied to the variable resistance element during write operation irrespective of manufacturing variations in the threshold voltage of the cell transistor. This allows for stabilization of the resistance values in the low and high resistance states, and therefore, read operation characteristics and reliability characteristics can be improved.

Embodiments of the present disclosure have been described above. The nonvolatile semiconductor storage device of the present disclosure is not limited to the above embodiments. Various changes, etc., can be made to the embodiments without departing the scope of the present disclosure.

For example, although, in the first to third embodiments, it is assumed that both of the word line voltage and the bit line voltage are adjusted, only any one of them may be adjusted. Also, although it is assumed above that the currents of the cell transistor performance measuring cells 12, 12a, and 12b are measured using a predetermined bias only once to determine an optimal voltage value, the voltage that has been once determined may be used to measure the current again and thereby finely adjust the voltage value to a final optimal voltage value.

Also, it is assumed above that an optimal voltage value is set for each of program operation and erase operation. Alternatively, to reduce the complexity of the testing step, an optimal voltage value may be set only for any one of program operation and erase operation, and a fixed voltage may be set for the other operation. In this case, an optimal voltage value may be desirably set only for erase operation because variations in the threshold voltage of the cell transistor TC have a more significant influence on erase operation, in which a voltage is applied from the source line SL to the variable resistance element RR through the cell transistor TC.

Although, in these embodiments, the configuration that employs resistive random access memory (ReRAM) has been described, the present disclosure is also applicable to magnetoresistive random access memory (MRAM), phase change random access memory (PRAM), etc.

In the nonvolatile semiconductor storage device of the present disclosure, a predetermined voltage can be applied to the variable resistance element during write operation irrespective of manufacturing variations in the threshold voltage of the cell transistor. This allows for stabilization of the resistance values in the low and high resistance states, and therefore, good read operation characteristics and reliability characteristics can be simultaneously achieved. Therefore, the present disclosure is useful for memory that stores data using the memristive effect.

What is claimed is:

1. A nonvolatile semiconductor storage device comprising:
   a plurality of memory cells arranged in a first matrix having rows and columns, each memory cell including a cell transistor and a variable resistance element connected to a first terminal of the cell transistor;
   a plurality of word lines provided, corresponding to the respective rows of the plurality of memory cells, each word line being connected to gates of the cell transistors included in the memory cells provided in the corresponding row;
   a plurality of first data lines provided, corresponding to the respective rows or columns of the plurality of memory cells, each first data line being connected to the variable resistance elements included in the plurality of memory cells provided in the corresponding row or column;
   a plurality of second data lines provided, corresponding to the respective rows or columns of the plurality of memory cells, each second data line being connected to second terminals of the cell transistors included in the plurality of memory cells provided in the corresponding row or column;
   a plurality of cell transistor performance measuring cells arranged in a second matrix having rows and columns, each cell transistor performance measuring cell including a transistor;
   at least one cell transistor performance measuring word line provided, corresponding to the respective rows of the at least one cell transistor performance measuring cell, each cell transistor performance measuring word line being connected to a gate of the at least one transistor provided in the corresponding row;
   a bit line driver configured to drive the first data line by applying a first voltage to the first data line;

a source line driver configured to drive the second data line by applying a second voltage to the second data line;
a column gate configured to select and connect one of the plurality of first data lines and one of the plurality of second data lines to the bit line driver and the source line driver, respectively;
a bit line regulator configured to supply a third voltage to be driven by the bit line driver;
a source line regulator configured to supply a fourth voltage to be driven by the source line driver;
a bit line switch provided between the bit line driver and the bit line regulator; and
a source line switch provided between the source line driver and the source line regulator, wherein:
the transistor of the at least one cell transistor performance measuring cell is provided, corresponding to each row or column of the at least one cell transistor performance measuring cell, and a drain or source of the transistor of at least one cell transistor performance measuring cell provided in the row or column is connected to all or a portion of the plurality of first data lines,
the transistor of the at least one cell transistor performance measuring cell is provided, corresponding to each row or column of the at least one cell transistor performance measuring cell, and one of the drain and source of the transistor of the at least one cell transistor performance measuring cell provided in the row or column, the one of the drain and source being not connected to the first data line, is connected to all or a portion of the plurality of second data lines,
the bit line switch selects and supplies the third voltage supplied by the bit line regulator or a fifth voltage supplied by a current measuring device, to the bit line driver, and
the source line switch selects and supplies the fourth voltage supplied by the source line regulator or a sixth voltage supplied by the current measuring device, to the source line driver.

2. The nonvolatile semiconductor storage device of claim 1, wherein
the transistor and the cell transistor are substantially the same in terms of at least one of gate channel length, gate channel width, and gate oxide film.

3. A nonvolatile semiconductor storage device comprising:
a plurality of memory cells arranged in a first matrix having rows and columns, each memory cell including a cell transistor and a variable resistance element connected to a first terminal of the cell transistor;
a plurality of word lines provided, corresponding to the respective rows of the plurality of memory cells, each word line being connected to gates of the cell transistors included in the memory cells provided in the corresponding row;
a plurality of first data lines provided, corresponding to the respective rows or columns of the plurality of memory cells, each first data line being connected to the variable resistance elements included in the plurality of memory cells provided in the corresponding row or column;
a plurality of second data lines provided, corresponding to the respective rows or columns of the plurality of memory cells, each second data line being connected to second terminals of the cell transistors included in the plurality of memory cells provided in the corresponding row or column;
a plurality of cell transistor performance measuring cells arranged in a second matrix having rows and columns, each cell transistor performance measuring cell including a transistor and a fixed resistor connected to a first end of the transistor;
at least one cell transistor performance measuring word line provided, corresponding to the respective rows of the at least one cell transistor performance measuring cell, each cell transistor performance measuring word line being connected to a gate of the at least one transistor provided in the corresponding row;
a bit line driver configured to drive the first data line by applying a first voltage to the first data line;
a source line driver configured to drive the second data line by applying a second voltage to the second data line;
a column gate configured to select and connect one of the plurality of first data lines and one of the plurality of second data lines to the bit line driver and the source line driver, respectively;
a bit line regulator configured to supply a third voltage to be driven by the bit line driver;
a source line regulator configured to supply a fourth voltage to be driven by the source line driver;
a bit line switch provided between the bit line driver and the bit line regulator; and
a source line switch provided between the source line driver and the source line regulator, wherein:
the fixed resistor of the at least one cell transistor performance measuring cell is provided, corresponding to each row or column of the at least one cell transistor performance measuring cell, and the fixed resistor of the at least one cell transistor performance measuring cell provided in the row or column is connected to all or a portion of the plurality of first data lines,
the transistor of the at least one cell transistor performance measuring cell is provided, corresponding to each row or column of the at least one cell transistor performance measuring cell, and a second terminal of the transistor included in the at least one cell transistor performance measuring cell provided in the row or column is connected to all or a portion of the plurality of second data lines,
the bit line switch selects and supplies the third voltage supplied by the bit line regulator or a fifth voltage supplied by a current measuring device, to the bit line driver, and
the source line switch selects and supplies the fourth voltage supplied by the source line regulator or a sixth voltage supplied by the current measuring device, to the source line driver.

4. The nonvolatile semiconductor storage device of claim 3, wherein
the fixed resistor has substantially the same resistance value as a resistance value of the variable resistance element in a low or high resistance state.

5. The nonvolatile semiconductor storage device of claim 3, wherein
there are a plurality of the cell transistor performance measuring cells, at least one of the fixed resistors has a first resistance value, and another fixed resistor or other fixed resistors have a second resistance value different from the first resistance value.

6. The nonvolatile semiconductor storage device of claim 5, wherein:
the first resistance value indicates a high resistance state, and
the second resistance value indicates a low resistance state.

7. A nonvolatile semiconductor storage device comprising:
a plurality of memory cells arranged in a matrix having rows and columns, each memory cell including a cell transistor and a variable resistance element connected to a first terminal of the cell transistor;
a plurality of word lines provided, corresponding to the respective rows of the plurality of memory cells, each word line being connected to gates of the cell transistors included in the memory cells provided in the corresponding row;
a plurality of first data lines provided, corresponding to the respective rows or columns of the plurality of memory cells, each first data line being connected to the variable resistance elements included in the plurality of memory cells provided in the corresponding row or column;
at least one reference cell configured to generate a reference current or a reference voltage during read operation;
at least one first reference data line and at least one second reference data line connected to the at least one reference cell;
at least one cell transistor performance measuring cell including a transistor;
at least one cell transistor performance measuring word line connected to a gate of the transistor of the at least one cell transistor performance measuring cell;
a bit line driver configured to drive the first data line or the first reference data line by applying a first voltage to the first data line or the first reference data line;
a source line driver configured to drive the second data line or the second reference data line by applying a second voltage to the second data line or the second reference data line;
a column gate configured to select and connect one of the plurality of first data lines and one of the plurality of second data lines to the bit line driver and the source line driver, respectively;
a bit line regulator configured to supply a third voltage to be driven by the bit line driver;
a source line regulator configured to supply a fourth voltage to be driven by the source line driver;
a bit line switch provided between the bit line driver and the bit line regulator; and
a source line switch provided between the source line driver and the source line regulator, wherein:
a drain or source of the transistor of the at least one cell transistor performance measuring cell is connected to all or a portion of the at least one first reference data line,
one of the drain and source of the transistor of the at least one cell transistor performance measuring cell, the one of the drain and source being not connected to the at least one first reference data line, is connected to all or a portion of the at least one second reference data line,
the bit line switch selects and supplies the third voltage supplied by the bit line regulator or a fifth voltage supplied by a current measuring device, to the bit line driver, and
the source line switch selects and supplies the fourth voltage supplied by the source line regulator or a sixth voltage supplied by the current measuring device, to the source line driver.

8. The nonvolatile semiconductor storage device of claim 7, wherein
the transistor and the cell transistor are substantially the same in terms of at least one of gate channel length, gate channel width, and gate oxide film.

9. A nonvolatile semiconductor storage device comprising:
a plurality of memory cells arranged in a matrix having rows and columns, each memory cell including a cell transistor and a variable resistance element connected to a first terminal of the cell transistor;
a plurality of word lines provided, corresponding to the respective rows of the plurality of memory cells, each word line being connected to gates of the cell transistors included in the memory cells provided in the corresponding row;
a plurality of first data lines provided, corresponding to the respective rows or columns of the plurality of memory cells, each first data line being connected to the variable resistance elements included in the plurality of memory cells provided in the corresponding row or column;
at least one reference cell configured to generate a reference current or a reference voltage during read operation;
at least one first reference data line and at least one second reference data line connected to the at least one reference cell;
at least one cell transistor performance measuring cell including a transistor and a fixed resistor connected to a first terminal of the transistor;
at least one cell transistor performance measuring word line connected to a gate of the transistor of the at least one cell transistor performance measuring cell;
a bit line driver configured to drive the first data line or the first reference data line by applying a first voltage to the first data line or the first reference data line;
a source line driver configured to drive the second data line or the second reference data line by applying a second voltage to the second data line or the second reference data line;
a column gate configured to select and connect one of the plurality of first data lines and one of the plurality of second data lines, or the first and second reference data lines, to the bit line driver and the source line driver, respectively;
a bit line regulator configured to supply a third voltage to be driven by the bit line driver;
a source line regulator configured to supply a fourth voltage to be driven by the source line driver;
a bit line switch provided between the bit line driver and the bit line regulator; and
a source line switch provided between the source line driver and the source line regulator, wherein:
the fixed resistor included in the at least one cell transistor performance measuring cell is connected to all or a portion of the at least one first reference data line,
a second terminal of the transistor included in the at least one cell transistor performance measuring cell is connected to all or a portion of the at least one second reference data line, the bit line switch selects and supplies the third voltage supplied by the bit line regulator or a fifth voltage supplied by a current measuring device, to the bit line driver, and the source line switch selects and supplies the fourth voltage supplied by the source line regulator or a sixth voltage supplied by the current measuring device, to the source line driver.

10. The nonvolatile semiconductor storage device of claim 9, wherein
the fixed resistor has substantially the same resistance value as a resistance value of the variable resistance element in a low or high resistance state.

11. The nonvolatile semiconductor storage device of claim 9, wherein
there are a plurality of the cell transistor performance measuring cells, at least one of the fixed resistors has a first resistance value, and another fixed resistor or other fixed resistors have a second resistance value different from the first resistance value.

12. The nonvolatile semiconductor storage device of claim 11, wherein:
the first resistance value indicates a high resistance state, and
the second resistance value indicates a low resistance state.

13. A nonvolatile semiconductor storage device comprising:
a memory cell including a first transistor and a variable resistance element connected to the first transistor;
a first data line connected to the variable resistance element;
a second data line connected to the first transistor;
a cell transistor performance measuring cell connected to the first data line and the second data line and including a second transistor;
a bit line driver configured to drive the first data line;
a source line driver configured to drive the second data line;
a bit line regulator configured to supply a first voltage;
a source line regulator configured to supply a second voltage;
a bit line switch provided between the bit line driver and the bit line regulator; and
a source line switch provided between the source line driver and the source line regulator, wherein:
the bit line switch selects and supplies the first voltage or a third voltage to the bit line driver,
the bit line driver applies the first voltage or the third voltage to the first data line,
the source line switch selects and supplies the second voltage or a fourth voltage to the source line driver, and
the source line driver applies the second voltage or the fourth voltage to the second data line.

14. The nonvolatile semiconductor storage device of claim 13, wherein
the first transistor and the second transistor are substantially the same in terms of at least one of gate channel length, gate channel width, and gate oxide film.

15. The nonvolatile semiconductor storage device of claim 13, wherein:
the cell transistor performance measuring cells includes a fixed resistor and
the fixed resistor has substantially the same resistance value as a resistance value of the variable resistance element in a low or high resistance state.

16. The nonvolatile semiconductor storage device of claim 13, wherein
the third and fourth voltages are supplied by a current measuring device.

17. A nonvolatile semiconductor storage device comprising:
a memory cell including a first transistor and a variable resistance element connected to the first transistor;
a first data line connected to the variable resistance element;
a second data line connected to the first transistor;
a reference cell configured to generate a reference current or a reference voltage during read operation, the reference cell being connected between a third data line and a fourth data line;
a cell transistor performance measuring cell connected to the third data line and the fourth data line and including a second transistor;
a bit line driver configured to drive the third data line;
a source line driver configured to drive the fourth data line;
a bit line regulator configured to supply a first voltage;
a source line regulator configured to supply a second voltage;
a bit line switch provided between the bit line driver and the bit line regulator; and
a source line switch provided between the source line driver and the source line regulator, wherein:
the bit line switch selects and supplies the first voltage or a third voltage to the bit line driver,
the bit line driver applies the first voltage or the third voltage to the third data line,
the source line switch selects and supplies the second voltage or a fourth voltage to the source line driver, and
the source line driver applies the second voltage or the fourth voltage to the fourth data line.

18. The nonvolatile semiconductor storage device of claim 17, wherein
the first transistor and the second transistor are substantially the same in terms of at least one of gate channel length, gate channel width, and gate oxide film.

19. The nonvolatile semiconductor storage device of claim 17, wherein:
the cell transistor performance measuring cells include a fixed resistor, and
the fixed resistor has substantially the same resistance value as a resistance value of the variable resistance element in a low or high resistance state.

20. The nonvolatile semiconductor storage device of claim 17, wherein
the third and fourth voltages are supplied by a current measuring device.

* * * * *